(12) United States Patent
Yamazaki et al.

(10) Patent No.: US 11,793,010 B2
(45) Date of Patent: Oct. 17, 2023

(54) DISPLAY DEVICE, DISPLAY MODULE, AND ELECTRONIC DEVICE

(71) Applicant: SEMICONDUCTOR ENERGY LABORATORY CO., LTD., Atsugi (JP)

(72) Inventors: Shunpei Yamazaki, Tokyo (JP); Satoshi Seo, Kanagawa (JP); Koji Kusunoki, Kanagawa (JP); Kei Takahashi, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 15/734,635

(22) PCT Filed: May 23, 2019

(86) PCT No.: PCT/IB2019/054253
§ 371 (c)(1),
(2) Date: Dec. 3, 2020

(87) PCT Pub. No.: WO2019/234543
PCT Pub. Date: Dec. 12, 2019

(65) Prior Publication Data
US 2021/0159435 A1     May 27, 2021

(30) Foreign Application Priority Data

Jun. 6, 2018 (JP) .................................. 2018-108658
Jun. 6, 2018 (JP) .................................. 2018-108659

(51) Int. Cl.
*G09G 3/30*     (2006.01)
*H10K 50/115*     (2023.01)
(Continued)

(52) U.S. Cl.
CPC .......... *H10K 50/115* (2023.02); *G09G 3/3225* (2013.01); *H10K 59/1213* (2023.02); *G09G 2300/0842* (2013.01)

(58) Field of Classification Search
CPC ............... H01L 51/502; H01L 27/3262; H01L 51/5218; H01L 51/5253; H01L 27/3206;
(Continued)

(56) References Cited

U.S. PATENT DOCUMENTS 6,121,726 A    9/2000   Codama et al.
6,563,480 B1    5/2003   Nakamura
(Continued)

FOREIGN PATENT DOCUMENTS

CN     001421842 A    6/2003
CN     001784134 A    6/2006
(Continued)

OTHER PUBLICATIONS

International Search Report (Application No. PCT/IB2019/054253) dated Sep. 3, 2019.
(Continued)

*Primary Examiner* — Jennifer T Nguyen
(74) *Attorney, Agent, or Firm* — Fish & Richardson P.C.

(57) ABSTRACT

A display device having a high display quality is provided. A display device that can perform desired display without image data conversion is provided. The display device includes a first pixel. The first pixel includes a first light-emitting element, a color conversion layer, and a first memory circuit. The first light-emitting element exhibits blue light. The color conversion layer has a function of converting light emitted by the first light-emitting element into light having a longer wavelength. A first image signal and a first correction signal are supplied to the first pixel. The first memory circuit has a function of retaining the first (Continued)

correction signal and a function of adding the first correction signal to the first image signal. The first pixel has a function of displaying an image using the first image signal and the first correction signal.

19 Claims, 18 Drawing Sheets

(51) Int. Cl.
   *G09G 3/3225* (2016.01)
   *H10K 59/121* (2023.01)

(58) Field of Classification Search
   CPC .......... H01L 27/3265; H01L 27/3244; H01L 51/5281; H01L 27/3276; H01L 27/14678; H01L 51/5293; H01L 27/3279; H01L 51/5246; G09G 3/3225; G09G 2300/0842; G09G 2300/0804; H10K 50/115; H01K 59/1213
   USPC .......................................................... 345/76
   See application file for complete search history.

(56) References Cited

U.S. PATENT DOCUMENTS

| | | | |
|---|---|---|---|
| 6,639,250 | B1 | 10/2003 | Shimoda et al. |
| 7,057,339 | B2 | 6/2006 | Boroson et al. |
| 7,301,171 | B2 | 11/2007 | Osame et al. |
| 7,602,385 | B2 | 10/2009 | Kurokawa et al. |
| 7,663,140 | B2 | 2/2010 | Yamazaki et al. |
| 7,674,650 | B2 | 3/2010 | Akimoto et al. |
| 7,737,444 | B2 | 6/2010 | Osame et al. |
| 7,956,349 | B2 | 6/2011 | Tsutsui et al. |
| 8,860,108 | B2 | 10/2014 | Yamazaki et al. |
| 8,884,852 | B2 | 11/2014 | Yamamoto et al. |
| 8,976,090 | B2 | 3/2015 | Yamamoto et al. |
| 9,088,006 | B2 | 7/2015 | Yamazaki et al. |
| 9,614,170 | B2 | 4/2017 | Ogiwara et al. |
| 9,646,532 | B2 * | 5/2017 | Onoyama ............ G09G 3/3233 |
| 9,721,998 | B2 | 8/2017 | Yamazaki |
| 10,777,762 | B2 | 9/2020 | Seo et al. |
| 10,790,462 | B2 | 9/2020 | Seo et al. |
| 2003/0098875 | A1 | 5/2003 | Kurokawa et al. |
| 2007/0103056 | A1 | 5/2007 | Cok |
| 2007/0109571 | A1 | 5/2007 | Kawamura |
| 2007/0138947 | A1 | 6/2007 | Popovic et al. |
| 2007/0145350 | A1 | 6/2007 | Kobori |
| 2007/0200492 | A1 | 8/2007 | Cok et al. |
| 2007/0205423 | A1 | 9/2007 | Yamazaki et al. |
| 2008/0001528 | A1 | 1/2008 | Eida |
| 2008/0111804 | A1 * | 5/2008 | Choi ............ G09G 3/3233 345/205 |
| 2008/0129195 | A1 | 6/2008 | Ishizaki et al. |
| 2008/0272690 | A1 | 11/2008 | Kuma et al. |
| 2009/0091241 | A1 | 4/2009 | Tsou et al. |
| 2009/0141204 | A1 | 6/2009 | Numao |
| 2009/0243498 | A1 | 10/2009 | Childs et al. |
| 2010/0109985 | A1 | 5/2010 | Ono |
| 2010/0289830 | A1 | 11/2010 | Yamamoto et al. |
| 2011/0074762 | A1 | 3/2011 | Shirasaki et al. |
| 2011/0316897 | A1 | 12/2011 | Teranishi |
| 2012/0223978 | A1 | 9/2012 | Yamamoto et al. |
| 2012/0228648 | A1 | 9/2012 | Mitsuya |
| 2013/0082906 | A1 | 4/2013 | Toyomura et al. |
| 2013/0146903 | A1 | 6/2013 | Ichikawa et al. |
| 2013/0249883 | A1 | 9/2013 | Hwang |
| 2013/0292671 | A1 | 11/2013 | Yamazaki et al. |
| 2015/0138183 | A1 | 5/2015 | Kishi et al. |
| 2015/0214281 | A1 | 7/2015 | Hack et al. |
| 2017/0062749 | A1 | 3/2017 | Seo et al. |
| 2017/0084229 | A1 | 3/2017 | Hirai et al. |
| 2017/0090246 | A1 | 3/2017 | Seo et al. |
| 2017/0110052 | A1 | 4/2017 | Kuo |
| 2017/0131594 | A1 | 5/2017 | Nakada et al. |
| 2017/0194387 | A1 | 7/2017 | Oh et al. |
| 2017/0271415 | A1 | 9/2017 | Yamazaki |
| 2018/0047800 | A1 * | 2/2018 | Choi ............... H01L 51/5253 |
| 2018/0151814 | A1 | 5/2018 | Hirose et al. |
| 2018/0182977 | A1 | 6/2018 | Hirose et al. |
| 2018/0374409 | A1 * | 12/2018 | Lee ................ H01L 27/3244 |
| 2019/0378859 | A1 | 12/2019 | Kawashima et al. |
| 2020/0142229 | A1 | 5/2020 | Kusunoki et al. |
| 2020/0403028 | A1 | 12/2020 | Kusunoki et al. |
| 2021/0013441 | A1 | 1/2021 | Seo et al. |
| 2021/0210707 | A1 * | 7/2021 | Levermore ........ H01L 51/5265 |

FOREIGN PATENT DOCUMENTS

| | | |
|---|---|---|
| CN | 101887689 A | 11/2010 |
| CN | 102654979 A | 9/2012 |
| CN | 106935714 A | 7/2017 |
| CN | 107731868 A | 2/2018 |
| EP | 3188272 A | 7/2017 |
| JP | 2003-228350 A | 8/2003 |
| JP | 2003-248469 A | 9/2003 |
| JP | 2005-309422 A | 11/2005 |
| JP | 2007-096055 A | 4/2007 |
| JP | 2007-123861 A | 5/2007 |
| JP | 2010-266494 A | 11/2010 |
| JP | 2010-286541 A | 12/2010 |
| JP | 2011-119674 A | 6/2011 |
| JP | 2012-145655 A | 8/2012 |
| JP | 2012-185328 A | 9/2012 |
| JP | 2014-197522 A | 10/2014 |
| JP | 2016-038490 A | 3/2016 |
| JP | 2017-037121 A | 2/2017 |
| JP | 2017-516146 | 6/2017 |
| KR | 2003-0044858 A | 6/2003 |
| KR | 2010-0122443 A | 11/2010 |
| KR | 2017-0080923 A | 7/2017 |
| KR | 2018-0018969 A | 2/2018 |
| TW | 201332097 | 8/2013 |
| WO | WO-2015/176108 | 11/2015 |
| WO | WO-2016/098570 | 6/2016 |
| WO | WO-2019/030595 | 2/2019 |
| WO | WO-2019/043483 | 3/2019 |
| WO | WO-2019/102315 | 5/2019 |

OTHER PUBLICATIONS

Written Opinion (Application No. PCT/IB2019/054253) dated Sep. 3, 2019.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn—Oxide Semiconductor and Its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

(56) References Cited

OTHER PUBLICATIONS

Amano.S et al., "Low Power LC Display Using In—Ga—Zn—Oxide TFTs Based on Variable Frame Frequency", SID DIGEST'10 : SID International Symposium Digest of Technical Papers, May 23, 2010, vol. 41, No. 1, pp. 626-629.
Taiwanese Office Action (Application No. 108119064) dated Mar. 28, 2023.

* cited by examiner

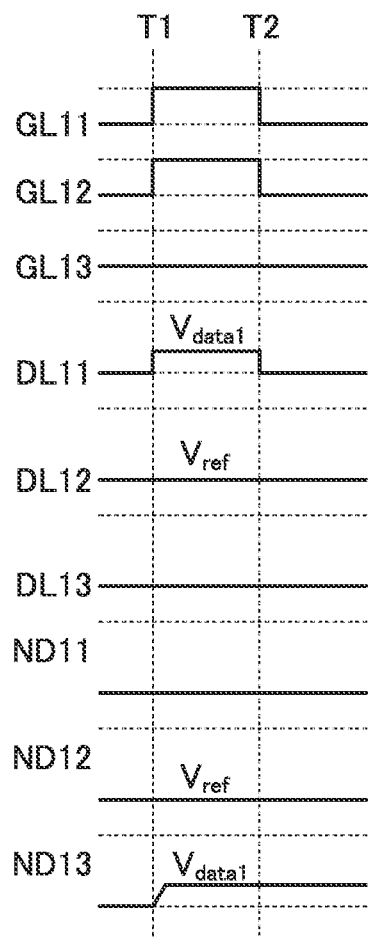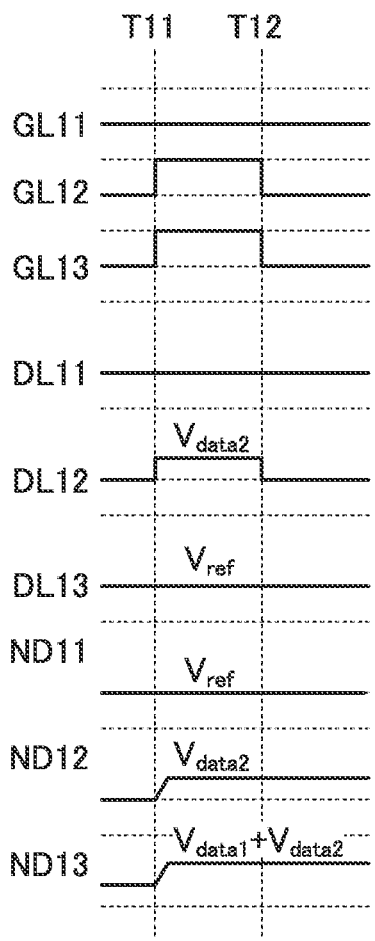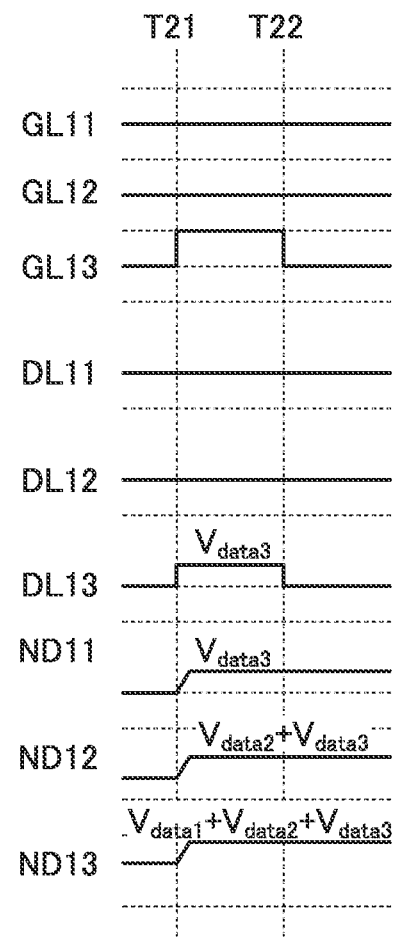

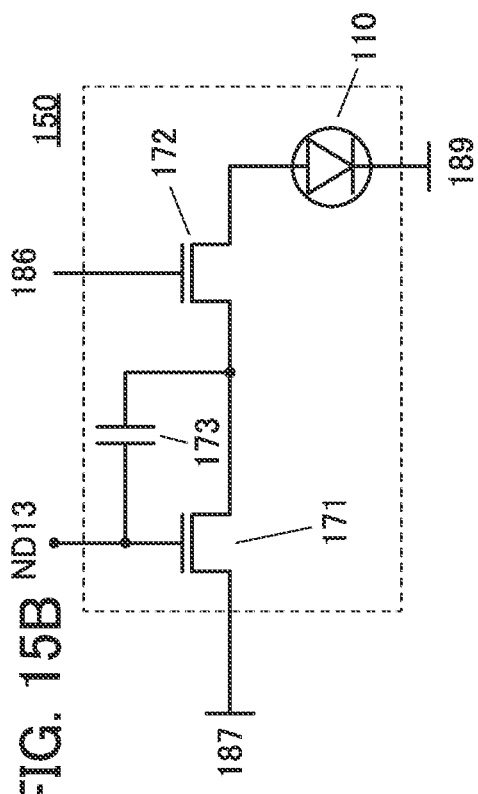
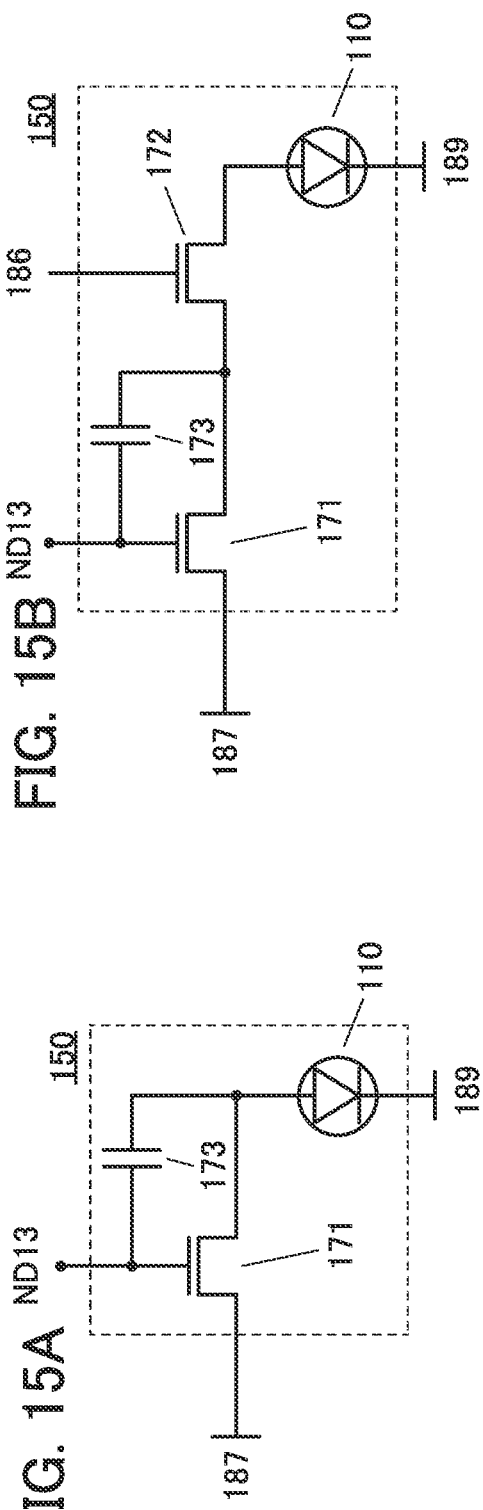
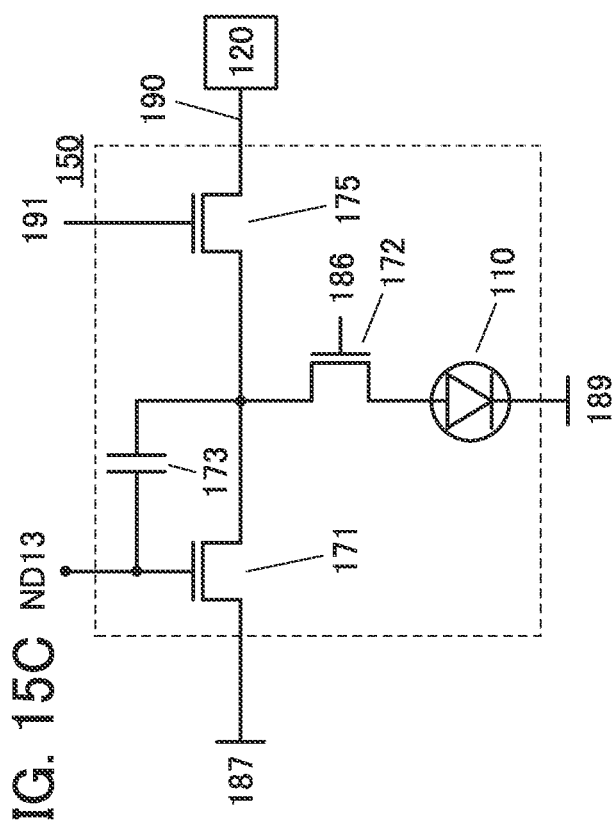

DISPLAY DEVICE, DISPLAY MODULE, AND ELECTRONIC DEVICE

CROSS REFERENCE TO RELATED APPLICATIONS

This application is a U.S. National Phase Application under 35 U.S.C. § 371 of International Application PCT/IB2019/054253, filed on May 23, 2019, which is incorporated by reference and claims the benefit of foreign priority applications filed in Japan on Jun. 6, 2018, as Application No. 2018-108658 and Application No. 2018-108659.

TECHNICAL FIELD

One embodiment of the present invention relates to a display device, a display module, and an electronic device.

Note that one embodiment of the present invention is not limited to the above technical field. Examples of the technical field of one embodiment of the present invention include a semiconductor device, a display device, a light-emitting apparatus, a power storage device, a memory device, an electronic device, a lighting device, an input device (e.g., a touch sensor), an input/output device (e.g., a touch panel), a driving method thereof, and a manufacturing method thereof.

BACKGROUND ART

In recent years, larger display devices have been required. For example, the screen size of the mainstream home-use television devices has been 50 inches or more diagonally. A larger screen size allows a larger amount of information to be displayed at a time, and a further increase in screen size of digital signage and the like has been demanded.

In addition, display devices with high resolution have been demanded. For example, display devices including a large number of pixels, such as full high definition (1920× 1080 pixels), 4K (e.g., 3840×2160 pixels or 4096×2160 pixels), and 8K (e.g., 7680×4320 pixels or 8192×4320 pixels) display devices, have been actively developed.

Light-emitting elements utilizing electroluminescence (hereinafter referred to as EL) have features such as ease of thinning and lightening, high-speed response to an input signal, and driving with a direct-current low voltage source; accordingly, application of the EL elements to display devices has been proposed. For example, Patent Document 1 discloses a flexible light-emitting device including an organic EL element.

The use of a quantum dot as a color conversion (wavelength conversion) material of an EL element is being considered. A quantum dot is a semiconductor nanocrystal with a diameter of several nanometers and contains approximately $1 \times 10^3$ to $1 \times 10^6$ atoms. A quantum dot confines an electron, a hole, or an exciton, which results in discrete energy states and an energy shift depending on the size of a quantum dot. This means that quantum dots made of the same substance emit light with different wavelengths depending on their size; accordingly, emission wavelengths can be easily adjusted by changing the size of quantum dots.

Although transistors used in such display devices are mainly formed using silicon as a semiconductor material, a technique in which a transistor formed using a metal oxide is used for a pixel of a display device has been developed in recent years. Patent Document 2 and Patent Document 3 each disclose a technique in which a metal oxide is used for a semiconductor material of a transistor.

REFERENCE

Patent Document

[Patent Document 1] Japanese Published Patent Application No. 2014-197522
[Patent Document 2] Japanese Published Patent Application No. 2007-123861
[Patent Document 3] Japanese Published Patent Application No. 2007-096055

SUMMARY OF THE INVENTION

Problems to be Solved by the Invention

For the proper display by a display device, image data needs to suit the resolution of the display device. In the case where a display device has an 8K resolution and the image data is for a 4K resolution, for example, the number of data must be converted by a fourfold increase to provide full-screen display. By contrast, in the case where a display device has a 4K resolution and the image data is for an 8K resolution, the number of data must be converted into a quarter. In addition, the HDR (high dynamic range) display technique, which increases image quality by luminance adjustment, has been introduced. Dedicated circuits are required for converting the number of data and generating image data by HDR processing, and thus the power consumption is increased. At least the conversion of original image data is preferably omitted when the data is input to pixels in a display device.

An object of one embodiment of the present invention is to increase the size of a display device. An object of one embodiment of the present invention is to provide a display device with high display quality. An object of one embodiment of the present invention is to provide a highly reliable display device. An object of one embodiment of the present invention is to provide a display device with low power consumption. An object of one embodiment of the present invention is to reduce the thickness and weight of a display device.

An object of one embodiment of the present invention is to provide a display device capable of performing proper display without image data conversion. An object of one embodiment of the present invention is to provide a display device capable of performing HDR display. An object of one embodiment of the present invention is to provide a display device capable of performing upconversion operation. An object of one embodiment of the present invention is to provide a display device in which the resolution of a displayed image can be increased. An object of one embodiment of the present invention is to provide a display device capable of displaying two or more images superimposed on each other. An object of one embodiment of the present invention is to provide a display device in which a voltage higher than or equal to the output voltage of a driver circuit can be applied to a pixel.

Note that the descriptions of these objects does not preclude the existence of other objects. One embodiment of the present invention does not need to achieve all of these objects. Other objects can be derived from the description of the specification, the drawings, and the claims.

Means for Solving the Problems

A display device of one embodiment of the present invention includes a first pixel. The first pixel includes a first light-emitting element, a color conversion layer, and a first memory circuit. The first light-emitting element exhibits blue light. The color conversion layer has a function of converting light emitted by the first light-emitting element into light having a longer wavelength. A first image signal and a first correction signal are supplied to the first pixel. The first memory circuit has a function of retaining the first correction signal and a function of adding the first correction signal to the first image signal. The first pixel has a function of displaying an image with the use of the first image signal and the first correction signal.

The first light-emitting element preferably includes a stack of a first light-emitting unit and a second light-emitting unit each exhibiting blue light. The first light-emitting element preferably includes a stack of the first light-emitting unit, the second light-emitting unit, and a third light-emitting unit each exhibiting blue light. Each of the light-emitting units preferably emits fluorescence.

The color conversion layer preferably includes a quantum dot.

The first pixel preferably further includes a transistor, and the transistor preferably includes a metal oxide in a channel formation region.

The display device preferably further includes a second pixel. The second pixel includes a second light-emitting element and a second memory circuit. The second light-emitting element exhibits blue light. A second image signal and a second correction signal are supplied to the second pixel. The second memory circuit has a function of retaining the second correction signal and a function of adding the second correction signal to the second image signal. The second pixel has a function of displaying an image using the second image signal and the second correction signal. The first pixel is a pixel exhibiting a color different from the second pixel. The second pixel is a pixel exhibiting blue light.

The second light-emitting element preferably includes a stack of a first light-emitting unit and a second light-emitting unit each exhibiting blue light. The second light-emitting element preferably includes a stack of the first light-emitting unit, the second light-emitting unit, and the third light-emitting unit each exhibiting blue light.

A third correction signal may be further supplied to the first pixel. At that time, the first memory circuit has a function of retaining the third correction signal and a function of adding the third correction signal to the first image signal. The first pixel has a function of displaying an image using the first image signal, the first correction signal, and the third correction signal.

A display device of one embodiment of the present invention includes a first pixel. The first pixel includes a first light-emitting element, a color conversion layer, and a first memory circuit. The first light-emitting element exhibits blue light. The first light-emitting element includes a stack of a first light-emitting unit exhibiting blue light, a second light-emitting unit exhibiting blue light, and a third light-emitting unit exhibiting blue light. The color conversion layer has a function of converting light emitted from the first light-emitting element into light having a longer wavelength. A first image signal, a first correction signal, and a second correction signal are supplied to the first pixel. The first memory circuit has a function of retaining the first correction signal and a function of adding the first correction signal to the first image signal, a function of retaining the second correction signal, and a function of adding the second correction signal to the first image signal. The first pixel has a function of displaying an image using the first image signal, the first correction signal, and the second correction signal. Each of the light-emitting units preferably emits fluorescence.

The display device preferably further includes a second pixel. The second pixel includes a second light-emitting element and a second memory circuit. The second light-emitting element exhibits blue light. The first light-emitting element includes a stack of the first light-emitting unit exhibiting blue light, the second light-emitting unit exhibiting blue light, and the third light-emitting unit exhibiting blue light. A second image signal, a third correction signal, and a fourth correction signal are supplied to the second pixel. The second memory circuit has a function of retaining the third correction signal, a function of adding the third correction signal to the second image signal, a function of retaining the fourth correction signal, and a function of adding the fourth correction signal to the second image signal. The second pixel has a function of displaying an image using the second image signal, the third correction signal, and the fourth correction signal. The first pixel is a pixel exhibiting a color different from the second pixel. The second pixel is a pixel exhibiting blue light.

One embodiment of the present invention is a module including the display device having any of the above structures. For example, the module is provided with a connector such as a flexible printed circuit (hereinafter referred to FPC) or a TCP (Tape Carrier Package), or an integrated circuit (IC) is mounted on the module by a COG (Chip On Glass) method, a COF (Chip On Film) method, or the like.

One embodiment of the present invention is an electronic device including the above-described display module and at least one of an antenna, a battery, a housing, a camera, a speaker, a microphone, and an operation button Effect of the Invention According to one embodiment of the present invention, a larger display device can be provided. According to one embodiment of the present invention, a display device with high display quality can be provided. According to one embodiment of the present invention, a highly reliable display device can be provided. According to one embodiment of the present invention, a display device with low power consumption can be provided. According to one embodiment of the present invention, a display device can be thinner and more lightweight.

According to one embodiment of the present invention, a display device in which appropriate display can be performed without image data conversion can be provided. According to one embodiment of the present invention, a display device capable of performing HDR display can be provided. According to one embodiment of the present invention, a display device capable of performing upconversion operation can be provided. According to one embodiment of the present invention, a display device capable of increasing the luminance of a displayed image can be provided. According to one embodiment of the present invention, a display device capable of displaying two or more images superimposed on each other can be provided.

According to one embodiment of the present invention, a display device capable of applying a voltage higher than or equal to an output voltage of a driver circuit to a pixel can be provided.

Note that the descriptions of these effects do not preclude the existence of other effects. One embodiment of the present invention does not necessarily have all of these effects. Other effects can be derived from the description of the specification, the drawings, and the claims.

BRIEF DESCRIPTION OF THE DRAWINGS

FIG. 13(A) to FIG. 13(C) Timing charts showing operation examples of a pixel.

FIG. 15(A) to FIG. 15(C) Circuit diagrams showing examples of a circuit block.

MODE FOR CARRYING OUT THE INVENTION

Figure 1A:
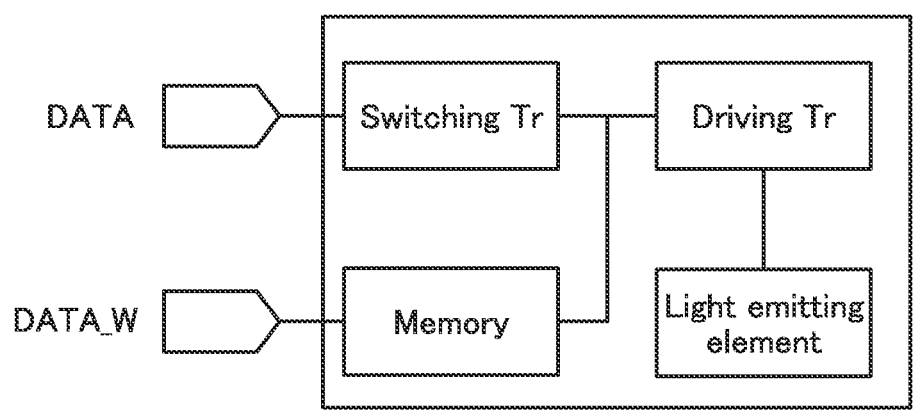
FIG. 1(A) and FIG. 1(B) Block diagrams illustrating examples of a pixel.

Embodiments are described in detail with reference to the drawings. Note that the present invention is not limited to the following description, and it is readily appreciated by those skilled in the art that modes and details of the present invention can be modified in various ways without departing from the spirit and scope of the present invention. Therefore, the present invention should not be construed as being limited to the description in the following embodiments and examples.

Note that in the structures of the invention described below, the same portions or portions having similar functions are denoted by the same reference numerals in different drawings, and description of such portions is not repeated. The same hatching pattern is used for portions having similar functions, and the portions are not denoted by specific reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that the terms "film" and "layer" can be used interchangeably depending on the case or the circumstances. For example, the term "conductive layer" can be replaced with the term "conductive film". As another example, the term "insulating film" can be replaced with the term "insulating layer".

Embodiment 1

In this embodiment, a display device of one embodiment of the present invention is described with reference to FIG. 1 to FIG. 9.

The display device of one embodiment of the present invention includes a first pixel and a second pixel. The first pixel includes a first light-emitting element, a color conversion layer, and a first memory circuit. The second pixel includes a second light-emitting element and a second memory circuit.

The second pixel is a pixel exhibiting blue light. The second light-emitting element exhibits blue light.

The first pixel is a pixel exhibiting a color different from the second pixel. For example, the first pixel is a pixel exhibiting red, green, or white light. The first light-emitting element exhibits blue light. The color conversion layer has a function of converting light emitted from the first light-emitting element into light having a longer wavelength.

Since the light-emitting element included in each of the pixels exhibits blue light, the number of layers and materials to be deposited can be reduced as compared with the case where a light-emitting element exhibiting white light is fabricated, and thus a manufacturing apparatus and steps can be simplified. Moreover, since the pixels each have light-emitting elements having the same structure, high alignment accuracy of a metal mask, inhabitation of bending, and the like are not required as compared with the case where a plurality of kinds of light-emitting elements are separately formed (e.g., the case where light-emitting elements exhibiting red, green, and blue light are each fabricated). Thus, such a pixel structure is easily applied to a large-sized display device.

Furthermore, it is preferable to use an organic EL element as the light-emitting element because the display device can be thinner and more lightweight. In particular, when an organic EL element having a tandem structure in which a plurality of light-emitting units are stacked is used, the light-emitting element can have a longer lifetime, and a display device having high reliability can be provided. For example, the light-emitting element preferably includes two or three light-emitting units each exhibiting blue light.

Moreover, as the color conversion layer, a quantum dot (QD) is preferably used. A quantum dot has an emission spectrum with a narrow peak, so that emission with high color purity can be obtained. Accordingly, the display quality of the display device can be improved.

A first image signal and a first correction signal are supplied to the first pixel. The first memory circuit has a function of retaining the first correction signal and a function of adding the first correction signal to the first image signal. The first pixel has a function of displaying an image using the first image signal and the first correction signal.

A second image signal and a second correction signal are supplied to the second pixel. The second memory circuit has a function of retaining the second correction signal and a function of adding the second correction signal to the second image signal. The second pixel has a function of displaying an image using the second image signal and the second correction signal.

In the display device of one embodiment of the present invention, in addition to an image signal corresponding to image data, a signal corresponding to data for correction (correction signal) can be supplied to the pixel. Accordingly, desired display is possible even when image data is supplied to the pixel without conversion; accordingly, the number of circuits dedicated for conversion of the image data can be reduced, and power consumption can be lowered. Supplying the correction signal to the pixel enables HDR display, upconversion operation, and improvement of luminance of the displayed image, for example. Furthermore, when the correction signal is an image signal different from the image signal, two or more images can be superimposed and displayed.

Note that the number of correction signals supplied to one pixel may be one or more (e.g., two).

Moreover, a metal oxide is preferably included in the channel formation region of a transistor included in a pixel because the off-state current can be extremely low and the correction signal can be retained for a long time.

[Pixel]

Figure 1B:
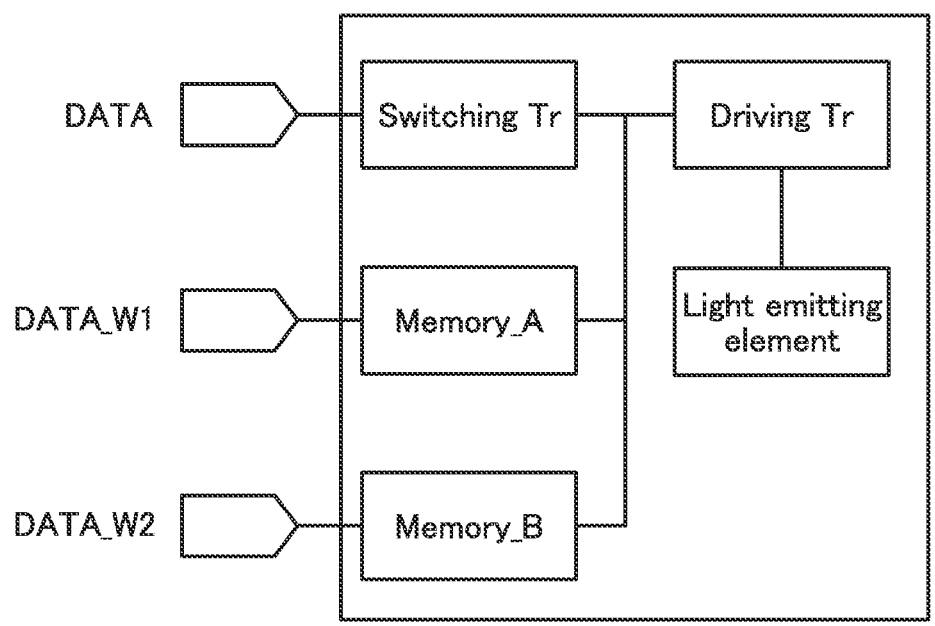

FIG. 1(A) and FIG. 1(B) illustrate block diagrams of a pixel of the display device of one embodiment of the present invention.

As illustrated in FIG. 1(A), the pixel included in the display device of one embodiment of the present invention includes a switching transistor (Switching Tr), a driving transistor (Driving Tr), a light-emitting element (Light emitting element), and a memory (Memory).

Data DATA_W is supplied to the memory. When the pixel is supplied with the data DATA_W in addition to image data DATA, a current flowing through the light-emitting element becomes large, so that the display device can have high luminance.

In the display device of one embodiment of the present invention, image correction such as upconversion of images, HDR display in which part of or all of the image in a display region is corrected, or improvement of the luminance of the displayed image can be performed by supplying the data DATA_W to the pixel. Furthermore, a plurality of images can be superimposed and displayed, or a voltage higher than or equal to an output voltage of a driver circuit can be supplied to the pixel.

Note that the pixel can have a plurality of memories. In that case, a plurality of data except the image data DATA can be supplied to the pixel. Thus, a plurality of processings such as the above image correction and processing of superimposing a plurality of images can be performed, and the processings can be performed highly precisely.

FIG. 1(B) illustrates an example of a pixel including two memories. The data DATA_W1 is supplied to a memory Memory_A, and the data DATA_W2 is supplied to a memory Memory_B. For example, image correction of the image data DATA can be performed using one of the memories, and another image can be superimposed on the image data DATA using the other of the memories.

The structure example of the pixel circuit is described in detail in Embodiment 2.

Figure 2A:
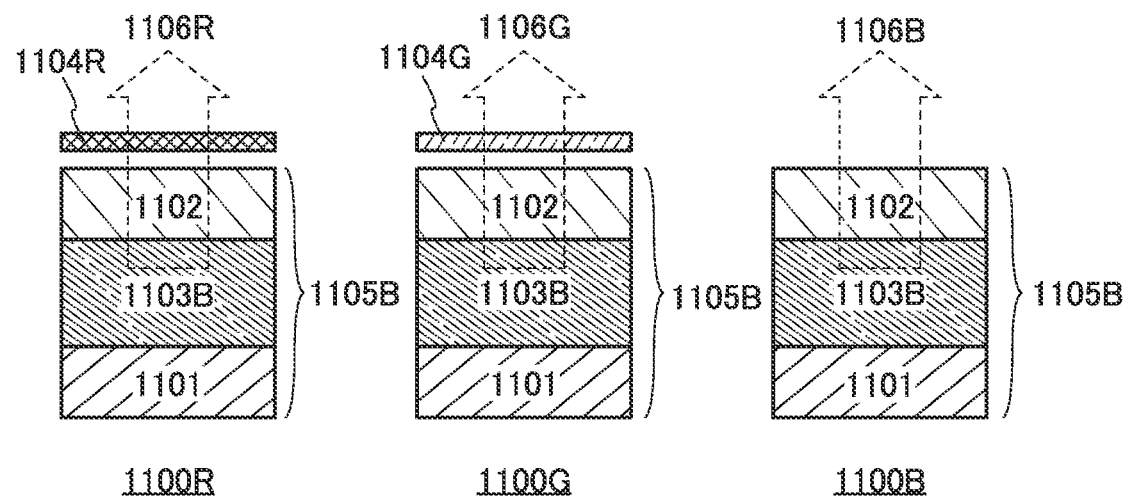
FIG. 2(A) and FIG. 2(B) Cross-sectional views illustrating examples of a pixel.
Figure 2B:
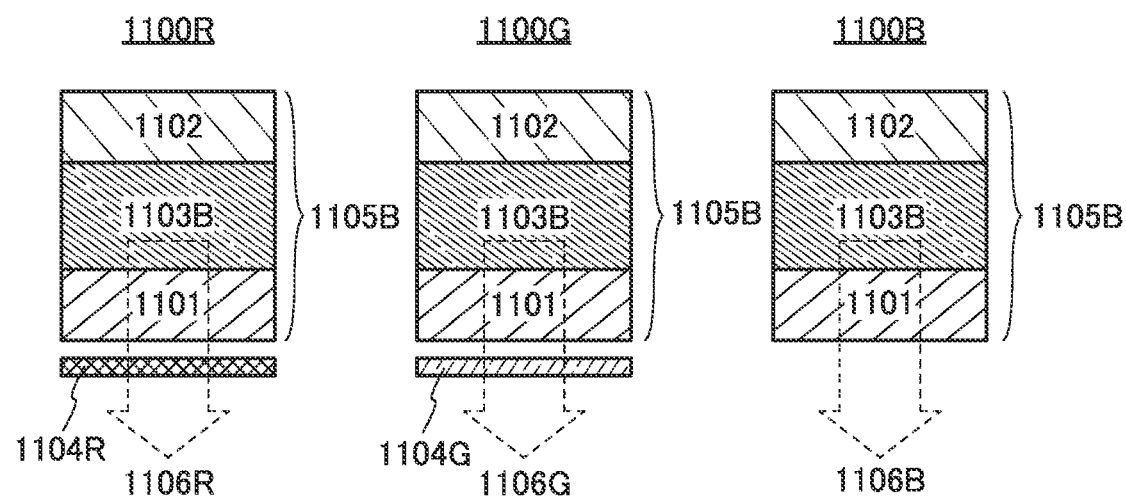

FIG. 2(A) and FIG. 2(B) are cross-sectional views each illustrating pixels of a display device of one embodiment of the present invention.

The display device illustrated in FIG. 2(A) has a top emission structure, and the display device illustrated in FIG. 2(B) has a bottom emission structure.

In FIG. 2(A) and FIG. 2(B), a display device in which pixels of three colors of red (R), green (G), and blue (B) express one color is described as an example. Specifically, FIG. 2(A) and FIG. 2(B) each illustrate a pixel 1100R exhibiting red light, a pixel 1100G exhibiting green light, and a pixel 1100B exhibiting blue light. Note that in the display device of one embodiment of the present invention, there is no limitation on the color elements, and a color except RGB (e.g., white, yellow, cyan, or magenta) may be used.

In this specification and the like, a pixel refers to one element whose brightness can be controlled, for example. Therefore, for example, one pixel expresses one color element by which brightness is expressed. In the case of a color display device having color elements of R (Red), G (Green), and B (Blue), a minimum unit of an image is composed of three pixels of an R pixel, a G pixel, and a B pixel. In that case, the pixel of each of RGB can also be referred to as a subpixel, and the three subpixels of RGB can be collectively referred to as a pixel.

The pixels 1100R, 1100G, and 1100B each include a light-emitting element 1105B exhibiting blue light.

The pixel 1100R further includes a color conversion layer 1104R. The color conversion layer 1104R can convert blue light into red light.

In the pixel 1100R, blue light emitted from the light-emitting element 1105B is converted into red light by the color conversion layer 1104R, and thus red light 1106R is extracted to the outside.

The pixel 1100G further includes a color conversion layer 1104G. The color conversion layer 1104G can convert blue light into green light.

In the pixel 1100G, the wavelength of blue light emitted from the light-emitting element 1105B is converted into green light by the color conversion layer 1104G, and thus green light 1106G is extracted to the outside.

A color conversion layer is not provided in the pixel 1100B, and thus blue light 1106B emitted from the light-emitting element 1105B is extracted to the outside.

As the color conversion layer, a fluorescent material, a quantum dot, and the like can be given.

A quantum dot is preferably used as the color conversion layer. The color conversion layer using a quantum dot can emit vivid-color light with a narrow half width. In addition, the color reproducibility of the display device can be improved.

The color conversion layer can be formed by a droplet discharge method (e.g., an inkjet method), a coating method, an imprinting method, a variety of printing methods (screen printing or offset printing), or the like. A color conversion film such as a quantum dot film may also be used.

There is no particular limitation on a material of a quantum dot, and examples include a Group 14 element, a Group 15 element, a Group 16 element, a compound of a plurality of Group 14 elements, a compound of an element belonging to any of Groups 4 to 14 and a Group 16 element, a compound of a Group 2 element and a Group 16 element, a compound of a Group 13 element and a Group 15 element, a compound of a Group 13 element and a Group 17 element, a compound of a Group 14 element and a Group 15 element, a compound of a Group 11 element and a Group 17 element, iron oxides, titanium oxides, spinel chalcogenides, and semiconductor clusters.

Specific examples include, but are not limited to, cadmium selenide; cadmium sulfide; cadmium telluride; zinc selenide; zinc oxide; zinc sulfide; zinc telluride; mercury sulfide; mercury selenide; mercury telluride; indium arsenide; indium phosphide; gallium arsenide; gallium phosphide; indium nitride; gallium nitride; indium antimonide; gallium antimonide; aluminum phosphide; aluminum arsenide; aluminum antimonide; lead selenide; lead telluride; lead sulfide; indium selenide; indium telluride; indium sulfide; gallium selenide; arsenic sulfide; arsenic selenide; arsenic telluride; antimony sulfide; antimony selenide; antimony telluride; bismuth sulfide; bismuth selenide; bismuth telluride; silicon; silicon carbide; germanium; tin; selenium; tellurium; boron; carbon; phosphorus; boron nitride; boron phosphide; boron arsenide; aluminum nitride; aluminum sulfide; barium sulfide; barium selenide; barium telluride; calcium sulfide; calcium selenide; calcium telluride; beryllium sulfide; beryllium selenide; beryllium telluride; magnesium sulfide; magnesium selenide; germanium sulfide; germanium selenide; germanium telluride; tin sulfide; tin selenide; tin telluride; lead oxide; copper fluoride; copper chloride; copper bromide; copper iodide; copper oxide; copper selenide; nickel oxide; cobalt oxide; cobalt sulfide; iron oxide; iron sulfide; manganese oxide; molybdenum sulfide; vanadium oxide; tungsten oxide; tantalum oxide; titanium oxide; zirconium oxide; silicon nitride; germanium nitride; aluminum oxide; barium titanate; a compound of selenium, zinc, and cadmium; a compound of indium, arsenic, and phosphorus; a compound of cadmium, selenium, and sulfur; a compound of cadmium, selenium, and tellurium; a compound of indium, gallium, and arsenic; a compound of indium, gallium, and selenium; a compound of indium, selenium, and sulfur; a compound of copper, indium, and sulfur; and combinations thereof. What is called an alloyed quantum dot, whose composition is represented by a given ratio, may be used.

Examples of the quantum dot include a core-type quantum dot, a core-shell quantum dot, and a core-multishell quantum dot. Quantum dots have a high proportion of surface atoms and thus have high reactivity and easily cohere together. For this reason, it is preferable that a protective agent be attached to, or a protective group be provided at the surfaces of quantum dots. The attachment of the protective agent or the provision of the protective group can prevent cohesion and increase solubility in a solvent. It can also reduce reactivity and improve electrical stability.

Since band gaps of quantum dots are increased as their size is decreased, the size is adjusted as appropriate so that light with a desired wavelength can be obtained. Light emission from the quantum dots is shifted to a blue color side, i.e., a high energy side, as the crystal size is decreased; accordingly, emission wavelengths of the quantum dots can be adjusted over a wavelength range of a spectrum of an ultraviolet region, a visible light region, and an infrared region by changing the size of quantum dots. The range of size (diameter) of quantum dots is, for example, greater than or equal to 0.5 nm and less than or equal to 20 nm, preferably greater than or equal to 1 nm and less than or equal to 10 nm. The emission spectra are narrowed as the size distribution of the quantum dots gets smaller, and thus light can be obtained with high color purity. The shape of the quantum dots is not particularly limited and may be a spherical shape, a rod shape, a circular shape, or the like. A quantum rod, which is a rod-shaped quantum dot, has a function of emitting directional light.

The light-emitting element 1105B includes a first electrode 1101, and an EL layer 1103B exhibiting blue light, and a second electrode 1102.

One of the first electrode 1101 and the second electrode 1102 serves as an anode and the other serves as a cathode.

In this embodiment, the first electrode 1101 serves as an anode and the second electrode 1102 serves as a cathode.

When a voltage higher than the threshold voltage of the light-emitting element is applied between the first electrode 1101 and the second electrode 1102, holes are injected from the anode (the first electrode 1101) side to the EL layer 1103B, and electrons are injected from the cathode (the second electrode 1102) side to the EL layer 1103B. The injected electrons and holes are recombined in the EL layer 1103B, and a light-emitting substance contained in the EL layer 1103B emits light.

Note that although not illustrated in FIG. 2(A) or FIG. 2(B), the light-emitting element 1105B is electrically connected to a transistor controlling light emission.

The EL layer 1103B includes at least a light-emitting layer containing a light-emitting substance exhibiting blue light.

As the light-emitting substance, there is no particular limitation thereon, and a substance emitting fluorescence (a fluorescent material), a substance emitting phosphorescence (a phosphorescent material), a substance exhibiting thermally activated delayed fluorescence (a thermally activated delayed fluorescent (TADF) material), an inorganic compound (e.g., a quantum dot material), or the like can be used.

Other than the light-emitting layer, the EL layer 1103B further includes functional layers such as a hole-injection layer, a hole-transport layer, an electron-transport layer, and an electron-injection layer. In the case of stacked EL layers, a charge generation layer is positioned between the EL layers. Either a low molecular compound or a high molecular compound can be used for the EL layer 1103B, and an inorganic compound may also be contained.

The EL layer 1103B may include a plurality of light-emitting units. Each of the light-emitting units includes at least a light-emitting layer containing a light-emitting substance exhibiting blue light. Each of the light-emitting units further includes functional layers such as a hole-injection layer, a hole-transport layer, an electron-transport layer, and an electron-injection layer. A charge generation layer is positioned between two light-emitting units.

The display device of one embodiment of the present invention is not limited to the structure in which pixels of three colors express one color. For example, a structure in which pixels of four colors of R (red), G (green), B (blue), and white (W) express one color may be applied to the display device. Specifically, FIG. 3(A) shows the pixel 1100R exhibiting red light, the pixel 1100G exhibiting green light, the pixel 1100B exhibiting blue light, and a pixel 1100W exhibiting white light.

Figure 3A:
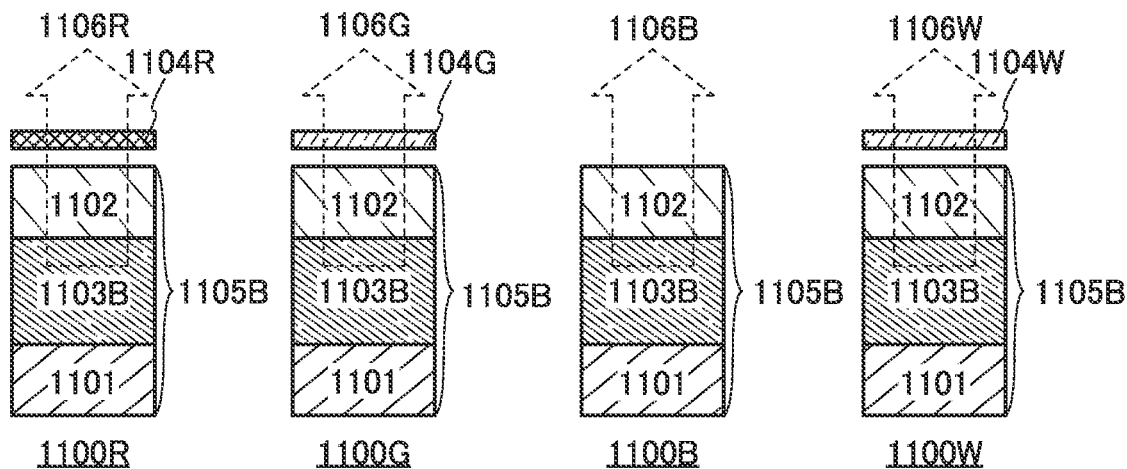
FIG. 3(A) to FIG. 3(C) Cross-sectional views illustrating examples of a pixel.

The pixel 1100W exhibiting white light and illustrated in FIG. 3(A) includes the light-emitting element 1105B exhibiting blue light and a color conversion layer 1104W. The color conversion layer 1104W can convert blue light into white light.

In the pixel 1100W, blue light emitted from the light-emitting element 1105B is converted into white light by the color conversion layer 1104W, and thus a white light 1106W is extracted to the outside.

Figure 3B:
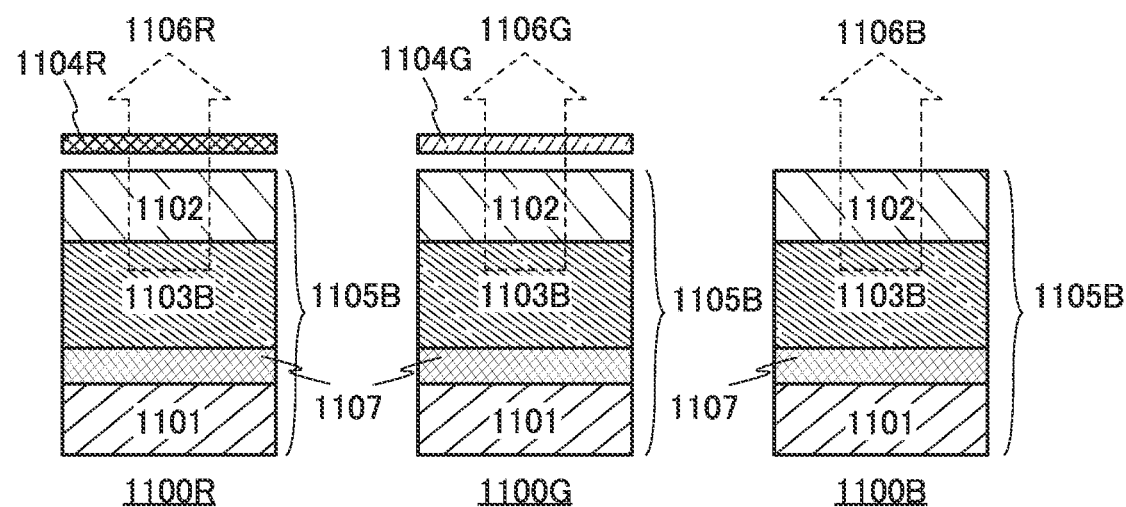
Figure 3C:
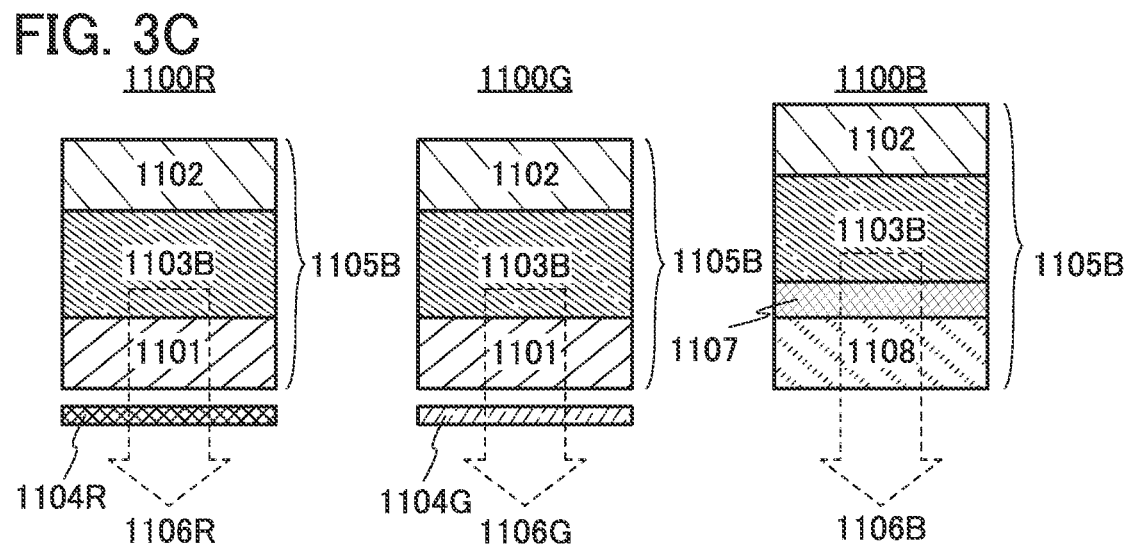

As illustrated in FIG. 3(B) and FIG. 3(C), to intensify only blue light, a micro-optical resonator (microcavity) structure may be formed by using a reflective electrode as the first electrode 1101 and a semi-transmissive and semi-reflective electrode as the second electrode 1102. With the microcavity structure, light emitted from the light-emitting layer included in the EL layer 1103B can be resonated between the electrodes, and light emitted through the second electrode 1102 can be intensified.

In FIG. 3(B) and FIG. 3(C), an optical adjustment layer 1107 is provided between the first electrode 1101 and the second electrode 1102.

FIG. 3(B) is an example in which a microcavity structure is applied to pixels exhibiting each color. FIG. 3(C) is an example in which a microcavity structure is applied to only the pixel 1100B exhibiting blue light.

A light-transmitting conductive film (transparent conductive film) is used for the optical adjustment layer 1107, and optical adjustment can be performed by controlling the thickness of the transparent conductive film. Note that the optical adjustment layer 1107 can also be regarded as an electrode of the light-emitting element. For example, a stacked structure of a reflective electrode and an optical adjustment layer may be applied to the first electrode 1101.

Furthermore, the optical distance between the first electrode 1101 and the second electrode 1102 may be adjusted using one or more functional layers included in the EL layer 1103B.

Specifically, when the wavelength of light obtained from the light-emitting layer is X, the distance between the first electrode 1101 and the second electrode 1102 is preferably adjusted to be in the neighborhood of mλ/2 (m is a natural number).

To amplify desired light (wavelength: X) obtained from the light-emitting layer, the optical path length from the first electrode 1101 to a region where the desired light is obtained in the light-emitting layer (light-emitting region) and the optical path length from the second electrode 1102 to the region where the desired light is obtained in the light-emitting layer (light-emitting region) are preferably adjusted to be in the neighborhood of (2m'+1)λ/4 (m' is a natural number). Here, the light-emitting region means a region where holes and electrons are recombined in the light-emitting layer.

By such optical adjustment, the spectrum of specific monochromatic light (in this embodiment, blue light) emitted from the light-emitting layer can be narrowed and light emission with high color purity can be obtained.

In that case, the optical path length between the first electrode 1101 and the second electrode 1102 is, to be exact, the total thickness from a reflective region in the first electrode 1101 to a reflective region in the second electrode 1102. However, it is difficult to exactly determine the reflective regions in the first electrode 1101 and the second electrode 1102; accordingly, it is assumed that the above effect can be sufficiently obtained wherever the reflective regions may be set in the first electrode 1101 and the second electrode 1102. Furthermore, the optical path length between the first electrode 1101 and the light-emitting layer that emits the desired light is, to be exact, the optical path length between the reflective region in the first electrode 1101 and the light-emitting region in the light-emitting layer that emits the desired light. However, it is difficult to precisely determine the reflective region in the first electrode 1101 and the light-emitting region in the light-emitting layer emitting the desired light; accordingly, it is assumed that the above effect can be sufficiently obtained wherever the reflective region and the light-emitting region may be set in the first electrode 1101 and the light-emitting layer emitting the desired light.

With the microcavity structure, the emission intensity of blue light in the front direction can be increased, whereby power consumption can be reduced.

One or both of the first electrode 1101 and the second electrode 1102 is/are a light-transmitting electrode (e.g., a transparent electrode or a semi-transmissive and semi-reflective electrode). The other of the first electrode 1101 and the second electrode 1102 is preferably a reflective electrode. The transparent electrode has a visible light transmittance of higher than or equal to 40%. The semi-transmissive and semi-reflective electrode has a visible light reflectance of higher than or equal to 20% and lower than or equal to 80%, and preferably higher than or equal to 40% and lower than or equal to 70%. The visible light reflectivity of the reflective electrode is higher than or equal to 40% and lower than or equal to 100%, preferably higher than or equal to 70% and lower than or equal to 100%.

[Light-Emitting Element]

Figure 4A:
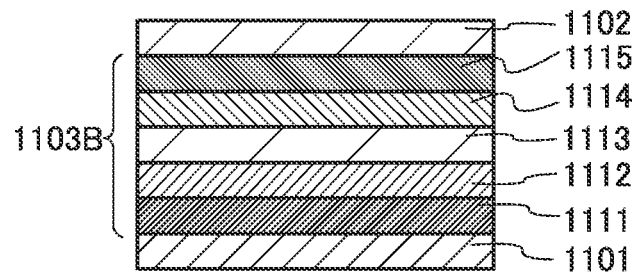
FIG. 4(A) to FIG. 4(D) Cross-sectional views illustrating examples of a light-emitting element.

FIG. 4(A) shows a specific example of a light-emitting element having a single structure.

The light-emitting element illustrated in FIG. 4(A) includes the EL layer 1103B between the first electrode 1101 and the second electrode 1102, and in the EL layer 1103B, a hole-injection layer 1111, a hole-transport layer 1112, a light-emitting layer 1113, an electron-transport layer 1114, and an electron-injection layer 1115 are stacked in this order from the first electrode 1101 side. The EL layer 1103B exhibits blue light.

Figure 4B:
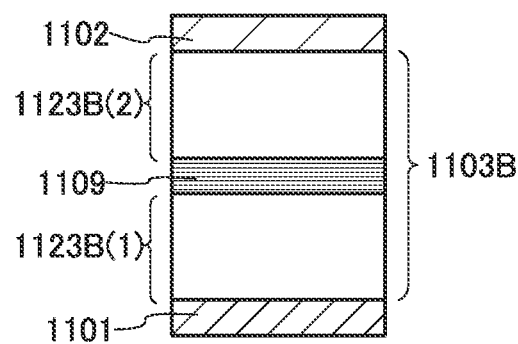
Figure 4D:
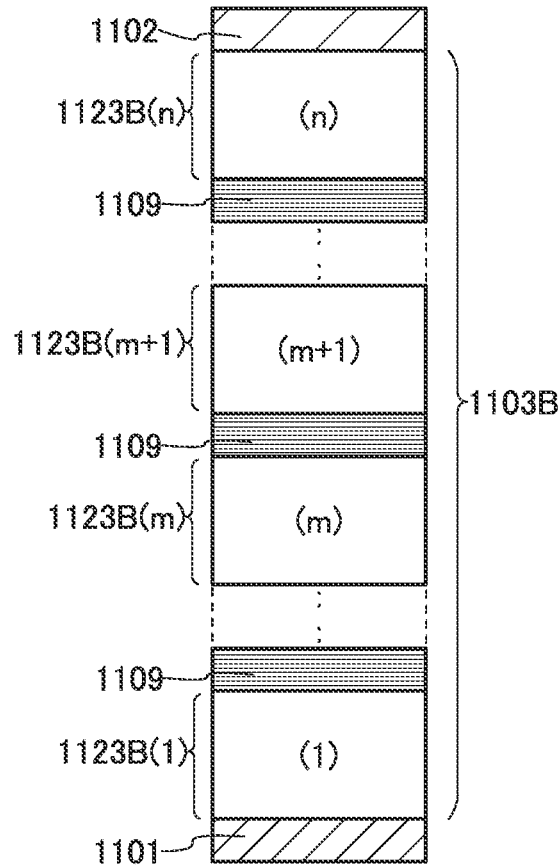
Figure 4C:
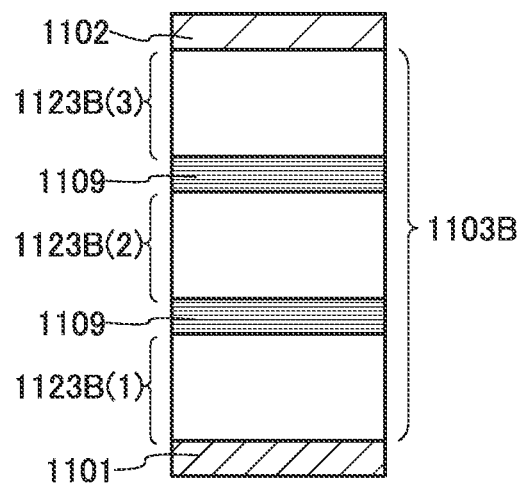

FIG. 4(B) to FIG. 4(D) show specific examples of a light-emitting element having a tandem structure. Each of the light-emitting elements illustrated in FIG. 4(B) to FIG. 4(D) includes a plurality of light-emitting units between the first electrode 1101 and the second electrode 1102. A charge generation layer 1109 is preferably provided between two light-emitting units. Each of the light-emitting units exhibits blue light. Note that the plurality of light-emitting units may contain the same light-emitting substance and may contain different light-emitting substances.

For example, the EL layer 1103B shown in FIG. 4(B) includes the charge generation layer 1109 between a light-emitting unit 1123B(1) and a light-emitting unit 1123B(2).

The charge generation layer 1109 has a function of injecting electrons into one of the light-emitting unit 1123B(1) and the light-emitting unit 1123B(2) and injecting holes into the other when voltage is applied between the first electrode 1101 and the second electrode 1102. Thus, when voltage is applied in FIG. 4(B) such that the potential of the first electrode 1101 is higher than that of the second electrode 1102, the charge-generation layer 1109 injects electrons into the light-emitting unit 1123B(1) and injects holes into the light-emitting unit 1123B(2).

Note that in terms of light extraction efficiency, the charge generation layer 1109 preferably transmits visible light (specifically, the visible light transmittance of the charge generation layer 1109 is preferably 40% or higher). The charge generation layer 1109 functions even when it has lower conductivity than the first electrode 1101 or the second electrode 1102.

The EL layer 1103B illustrated in FIG. 4(C) includes the charge generation layer 1109 between the first light-emitting unit 1123B(1) and the second light-emitting unit 1123B(2) and includes the charge generation layer 1109 between the second light-emitting unit 1123B(2) and a third EL layer 1103B(3). The light-emitting element illustrated in FIG. 4(D) includes n EL layers is a natural number of 2 or more) and includes the charge generation layers 1109 between the EL layers.

The behavior of electrons and holes in the charge generation layer 1109 provided between a light-emitting unit 1123B(m) and a light-emitting unit 1123B(m+1) is described. When a voltage higher than the threshold voltage of the light-emitting element is applied between the first electrode 1101 and the second electrode 1102, holes and electrons are generated in the charge generation layer 1109, holes move into the light-emitting unit 1123B(m+1) provided on the second electrode 1102 side, and electrons move into the light-emitting unit 1123B(m) provided on the first electrode 1101 side. Holes injected to the light-emitting unit 1123B(m+1) and electrons injected from the second electrode 1102 side are recombined so that a light-emitting substance contained in the light-emitting unit 1123B(m+1) emits light. Electrons injected to the light-emitting unit 1123B(m) and holes injected from the first electrode 1101 side are recombined so that a light-emitting substance included in the light-emitting unit 1123B(m) emits light. Thus, the holes and electrons generated in the charge generation layer 1109 cause light emission in the respective light-emitting units.

Note that the light-emitting units can be provided in contact with each other without the charge generation layer provided therebetween when the same structure as the charge generation layer is formed between the light-emitting units. For example, in the case where a charge generation region is formed on one surface of the light-emitting unit, the light-emitting unit can be provided to be in contact with the surface.

A light-emitting element with a tandem structure has higher current efficiency than a light-emitting element with a single structure, and needs a smaller amount of current when the devices emit light with the same luminance. Accordingly, the lifetime of the light-emitting element can be long, and the display device can have high reliability.

There is no particular limitation on the light-emitting substance of each of the light-emitting units. To improve reliability, a plurality of light-emitting units exhibiting fluorescence is preferably stacked. Furthermore, one or more light-emitting units exhibiting fluorescence and one or more light-emitting units exhibiting phosphorescence may be stacked.

[Display Device]

Specific examples of a display device of one embodiment of the present invention are described with reference to FIG. 5 to FIG. 8.

Figure 5A:
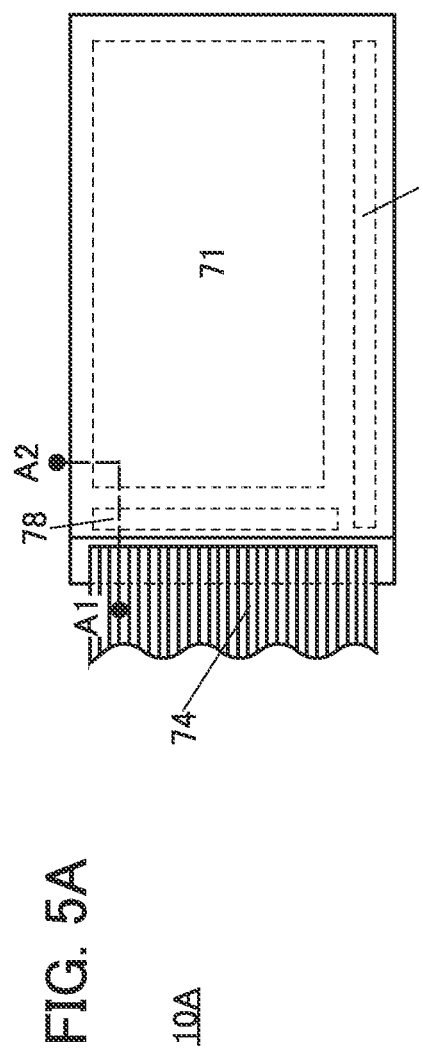
FIG. 5(A) A top view illustrating an example of a display device.
Figure 5B:
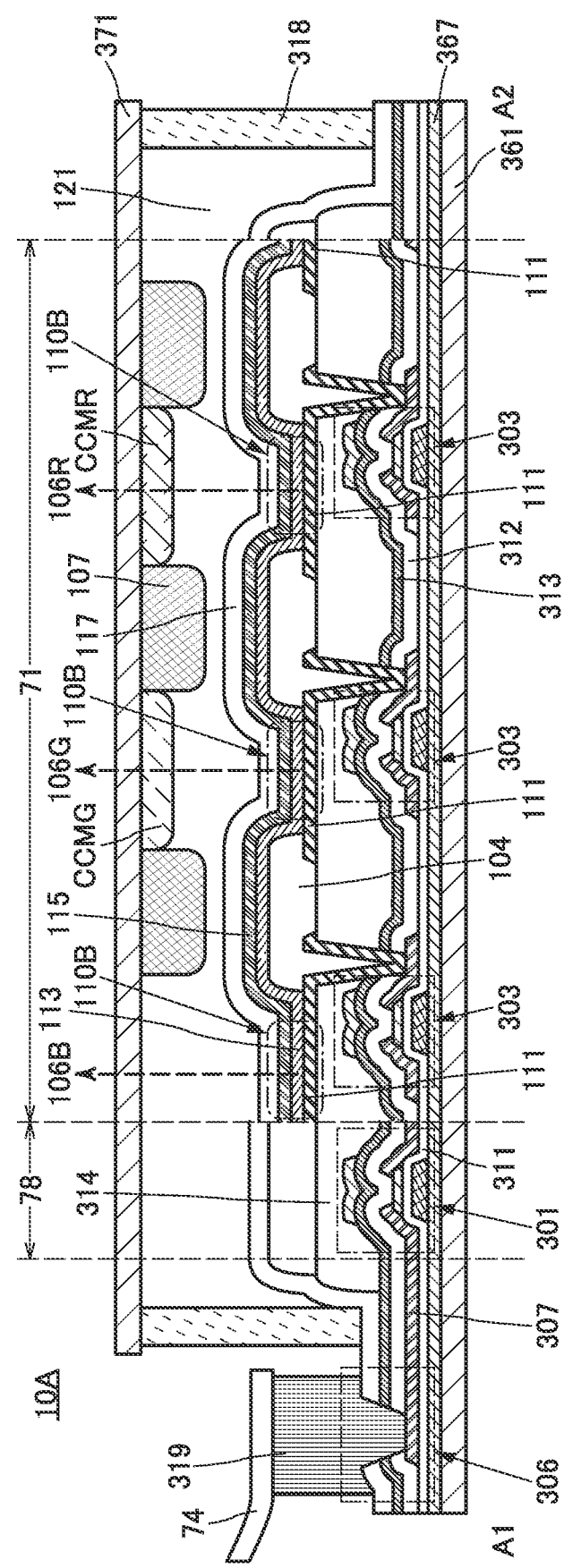
FIG. 5(B) A cross-sectional view illustrating an example of a display device.

FIG. 5(A) shows a top view of a display device 10A. FIG. 5(B) is a cross-sectional view taken along a dashed-dotted line A1-A2 in FIG. 5(A).

The display device illustrated in FIG. 5(A) includes a display portion 71 and a driver circuit 78. An FPC 74 is connected to the display device 10A.

The display device 10A has a top emission structure.

As illustrated in FIG. 5(B), the display device 10A includes a substrate 361, an insulating layer 367, transistors 301 and 303, a wiring 307, an insulating layer 314, a light-emitting element 110B, an insulating layer 104, a protective layer 117, a partition 107, a color conversion layer CCMR, a color conversion layer CCMG, a bonding layer 318, a substrate 371, and the like.

The light-emitting element 110B exhibits blue light. The light-emitting element 110B includes a pixel electrode 111, an EL layer 113, and a common electrode 115. The pixel electrode 111 is electrically connected to a source or a drain of the transistor 303. They are directly connected to each other or connected via another conductive layer. The EL layer 113 and the common electrode 115 are provided over a plurality of light-emitting elements.

The light-emitting element 110B is covered with the protective layer 117.

In the pixel exhibiting red light, the light-emitting element 110B overlaps with the color conversion layer CCMR with the protective layer 117 positioned therebetween. The blue light emitted from the light-emitting element 110B is converted into red light by the color conversion layer CCMR so that red light 106R is extracted to the outside.

In the pixel exhibiting green light, the light-emitting element 110B overlaps with the color conversion layer CCMG with the protective layer 117 positioned therebetween. The blue light emitted from the light-emitting element 110B is converted into green light by the color conversion layer CCMG so that green light 106G is extracted to the outside.

Since no color conversion layer is provided in the pixel exhibiting blue light, blue light 106B emitted from the light-emitting element 110B is extracted to the outside through the protective layer 117.

For example, the color conversion layers CCMR and CCMG can be formed by an inkjet method after the partition 107 is formed. Accordingly, a color conversion layer is easily formed in a desired region.

The insulating layer 104 covers an end portion of the pixel electrode 111. Two adjacent pixel electrodes 111 are electrically insulated from each other by the insulating layer 104.

The protective layer 117 is provided over the light-emitting element 110B, covers an end portion of the common electrode 115, and are in contact with the insulating layer 104 and an insulating layer 313 on the outside of the end portion of the common electrode 115. Accordingly, impurities can be inhibited from entering the transistor and the light-emitting elements. In particular, an inorganic film with a high barrier property (or an inorganic insulating film) is preferably used for the protective layer 117 and the insulating layer 313. Furthermore, an inorganic insulating film with a high barrier property is preferably used also for the insulating layer 104. When a plurality of inorganic films (or inorganic insulating films) are stacked in contact with each other at the end portion of the display device and its periphery, impurities are less likely to enter from the outside; so that deterioration of the transistor and the light-emitting element can be inhibited.

The substrate 361 and the substrate 371 are bonded to each other with a bonding layer 318. A space 121 formed by the substrate 361, the substrate 371, and the bonding layer 318 is preferably filled with a resin or an inert gas such as nitrogen or argon.

For the substrate 361 and the substrate 371, a material such as glass, quartz, a resin, a metal, an alloy, or a semiconductor can be used. For the substrate 371 through which light from the light-emitting element is extracted, a material that transmits the light is used. A flexible substrate is preferably used as each of the substrate 361 and the substrate 371.

For the bonding layer, various curable adhesives such as a photocurable adhesive (e.g., an ultraviolet curable adhesive), a reactive curable adhesive, a thermosetting adhesive, and an anaerobic adhesive can be used. An adhesive sheet or the like may be used.

The driver circuit 78 includes the transistor 301. The display portion 71 includes the transistor 303.

Each transistor includes a gate, a gate insulating layer 311, a semiconductor layer, a back gate, a source, and a drain. The gate (the lower gate) and the semiconductor layer overlap with each other with the gate insulating layer 311 positioned therebetween. The back gate (the upper gate) and the semiconductor layer overlap with each other with an insulating layer 312 and the insulating layer 313 positioned therebetween. It is preferable that the two gates be electrically connected to each other.

The structure of the transistor may be different between the driver circuit 78 and the display portion 71. The driver circuit 78 and the display portion 71 may each include a plurality of kinds of transistors.

The transistor, the capacitor, the wiring, and the like are provided to overlap with a light-emitting region of the light-emitting element 110B, whereby the aperture ratio of the display portion 71 can be increased.

A material through which impurities such as water and hydrogen are less likely to be diffused is preferably used for at least one of the insulating layer 312, the insulating layer 313, and the insulating layer 314. Diffusion of impurities from the outside into the transistors can be effectively inhibited, leading to improved reliability of the display device. The insulating layer 314 functions as a planarization layer.

The insulating layer 367 functions as a base film. A material through which impurities such as water and hydrogen are less likely to be diffused is preferably used for the insulating layer 367.

A connection portion 306 includes the wiring 307. The wiring 307 can be formed using the same material and the same step as those of the sources and the drains of the transistors. The wiring 307 is electrically connected to an external input terminal through which a signal or a potential from the outside is transmitted to the driver circuit 78. Here, an example in which the FPC 74 is provided as an external input terminal is shown. The FPC 74 and the wiring 307 are electrically connected to each other through a connector 319.

As the connector 319, any of various anisotropic conductive films (ACF), anisotropic conductive pastes (ACP), and the like can be used.

The protective layer 117 preferably includes at least one layer of an inorganic film (or an inorganic insulating film) and further preferably includes one or more layers of inorganic films and one or more layers of organic films. For example, the protective layer 117 may include a first inorganic film over the common electrode 115, an organic film over the first inorganic film, and a second inorganic film over the organic film.

The inorganic film (or the inorganic insulating film) preferably has high moisture resistance through which water is less likely to be diffused and transmitted. The inorganic film (or the inorganic insulating film) through which one or both of hydrogen and oxygen are less likely to be diffused and transmitted is further preferable. Thus, the inorganic film (or the inorganic insulating film) can function as a barrier film. Diffusion of impurities from the outside into the light-emitting element can be effectively suppressed, which enables the fabrication of a highly reliable display device.

For the protective layer 117, an oxide insulating film, a nitride insulating film, an oxynitride insulating film, a nitride oxide insulating film, or the like can be used. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film. Examples of the nitride oxide insulating film include a silicon nitride oxide film.

Note that in this specification and the like, oxynitride refers to a material that contains more oxygen than nitrogen, and nitride oxide refers to a material that contains more nitrogen than oxygen.

In particular, a silicon nitride film, a silicon nitride oxide film, and an aluminum oxide film are suitably used for the protective layer 117 because those films each have high moisture resistance.

An inorganic film containing ITO, Ga—Zn oxide, Al—Zn oxide, In—Ga—Zn oxide, or the like can be used for the protective layer 117. The inorganic film preferably has high resistance, specifically, higher resistance than the common electrode 115. The inorganic film may further contain nitrogen.

A visible-light-transmitting conductive film used for the common electrode 115 and a visible-light-transmitting inorganic film used for the protective layer 117 may contain the same metal element, for example. Adhesion between the common electrode 115 and the protective layer 117 can be increased when the two films contain a common metal element, whereby film separation and entry of impurities from an interface between the common electrode 115 and the protective layer 117 can be prevented.

The protective layer 117 may include an organic insulating film using an acrylic resin, an epoxy resin, a polyimide resin, a polyamide resin, a polyimide amide resin, a polysiloxane resin, a benzocyclobutene resin, a phenol resin, or the like.

The specific resistance of the protective layer 117 is preferably higher than or equal to $10^{10}$ Ωcm at 20° C.

The protective layer 117 can be formed by a chemical vapor deposition (CVD) method (such as a plasma-enhanced CVD (PECVD) method), a sputtering method (such as a DC sputtering method, an RF sputtering method, and an ion beam sputtering method), an atomic layer deposition (ALD) method, or the like.

A sputtering method and an ALD method are capable of forming a film at a low temperature. The EL layer 113 included in the light-emitting element has low heat resistance. Therefore, the protective layer 117 formed after the fabrication of the light-emitting element is preferably formed at a relatively low temperature, typically a temperature of lower than or equal to 100° C., and a sputtering method and an ALD method are suitable.

The protective layer 117 may have a stacked-layer structure including two or more insulating films formed by different deposition methods.

Note that an inorganic insulating film or an organic insulating film that can be used for the protective layer 117 may be used for the insulating layer 104.

The insulating layer 104 formed before the fabrication of the light-emitting element can be formed at high temperature. By making substrate temperature during deposition high (e.g., higher than or equal to 100° C. and lower than or equal to 350° C.), a dense film with a high barrier property can be formed. Not only a sputtering method and an ALD method but also a CVD method is suitable for forming the insulating layer 104. A CVD method is preferable because it has a high deposition rate.

For the substrate 361 and the substrate 371, a material such as glass, quartz, an organic resin, a metal, an alloy, or a semiconductor can be used.

The partition 107 may have a light-blocking property. Specifically, the partition 107 blocks light from an adjacent light-emitting element or an adjacent color conversion layer and inhibits mixture of colors between adjacent pixels. The partition 107 can be formed using, for example, a metal material, a resin material containing a pigment or dye, or the like. Note that in the case where the partition 107 has a light-blocking property, the partition 107 is preferably provided in a region other than the display portion, such as a driver circuit portion, because undesired leakage of guided light or the like can be inhibited.

Figure 6:
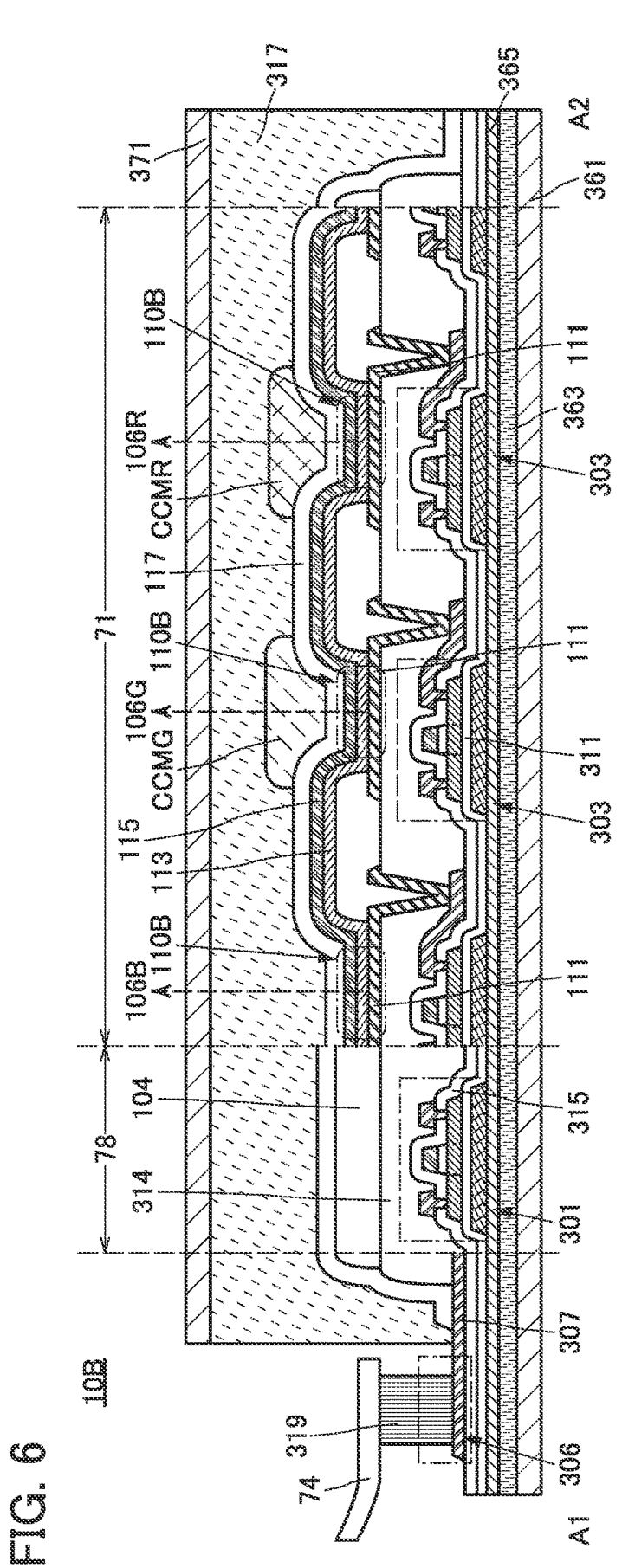
FIG. 6 A cross-sectional view illustrating an example of a display device.
Figure 7:
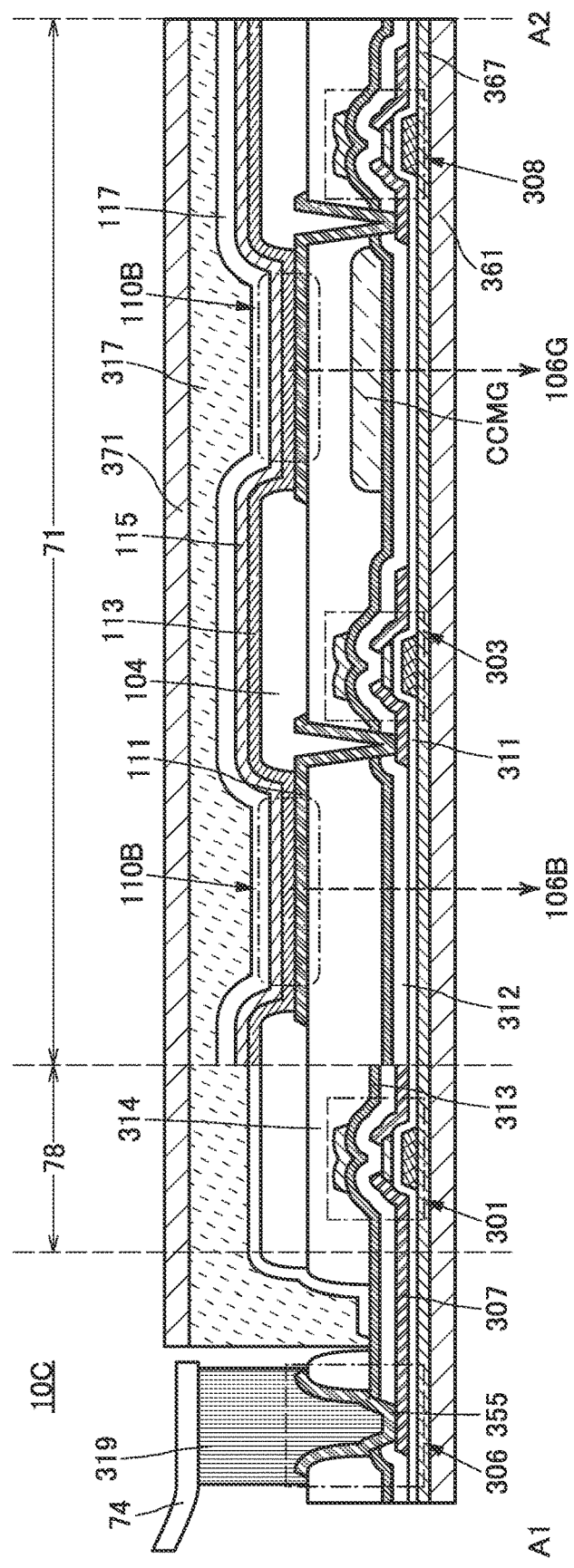
FIG. 7 A cross-sectional view illustrating an example of a display device.
Figure 8:
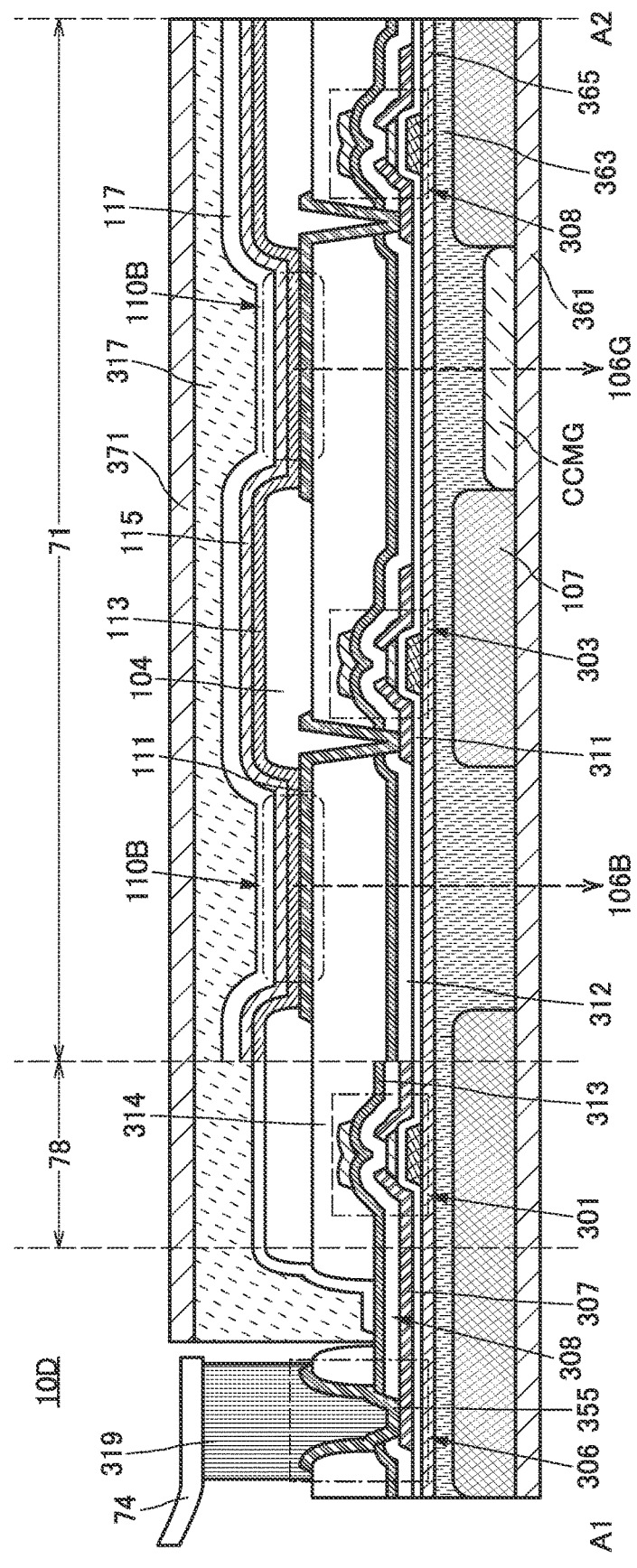
FIG. 8 A cross-sectional view illustrating an example of a display device.

FIG. 6 shows a cross-sectional view of a display device 10B, FIG. 7 shows a cross-sectional view of a display device 10C, and FIG. 8 shows a cross-sectional view of a display device 10D. Each of the top views of the display devices 10B, 10C, and 10D is similar to that of the display device 10A illustrated in FIG. 5(A). FIG. 6 to FIG. 8 correspond to cross-sectional views taken along dashed-dotted line A1-A2 in FIG. 5(A). Note that portions similar to those of the display device 10A are not described in some cases.

The display device 10B illustrated in FIG. 6 has a top emission structure.

The display device 10B includes the substrate 361, a bonding layer 363, an insulating layer 365, the transistors 301 and 303, the wiring 307, the insulating layer 314, the light-emitting element 110B, the insulating layer 104, the protective layer 117, the color conversion layer CCMR, the color conversion layer CCMG, a bonding layer 317, the substrate 371, and the like.

In the display device 10A illustrated in FIG. 5(B), the color conversion layer CCMR and the color conversion layer CCMG are provided for the substrate 371. Specifically, in FIG. 5(B), the light-emitting element 110B overlaps with the color conversion layer CCMR or the color conversion layer CCMG with the protective layer 117 and the space 121 positioned therebetween. In contrast, in the display device 10B illustrated in FIG. 6, the color conversion layer CCMR and the color conversion layer CCMG are provided over and in contact with the protective layer 117. Specifically, in FIG. 6, the light-emitting element 110B overlaps with the color conversion layer CCMR or the color conversion layer CCMG with the protective layer 117 positioned therebetween, and the color conversion layer CCMR or the color conversion layer CCMG overlaps with the substrate 371 with the bonding layer 317 positioned therebetween.

In the case where the color conversion layer is directly formed over the protective layer 117, the alignment with the light-emitting region of the light-emitting element becomes easy as compared with the case where the color conversion layer is formed for the substrate 371, which is preferable. In the case where the color conversion layer is formed for the substrate 371, the range of choices for formation methods and formation conditions is widened as compared with the case where the color conversion layer is directly formed over the protective layer 117, which is preferable.

The substrate 361 and the substrate 371 are bonded to each other with the bonding layer 317. The substrate 361 and the insulating layer 365 are bonded to each other with the bonding layer 363.

The display device 10B is formed by transferring the transistor, the light-emitting element, and the like formed over a formation substrate to the substrate 361. The substrate 361 and the substrate 371 are preferably flexible. Accordingly, the flexibility of the display device 10B can be increased.

The structures of the transistors 301 and 303 of the display device 10B are different from those of the display device 10A.

Each of the transistors 301 and 303 illustrated in FIG. 6 includes a back gate, the gate insulating layer 311, a semiconductor layer, a gate insulating layer, a gate, an insulating layer 315, a source, and a drain. The semiconductor layer includes a channel formation region and a pair of low-resistance regions. The back gate (the lower gate) and the channel formation region overlap with each other with the gate insulating layer 311 positioned therebetween. The gate (the upper gate) and the channel formation region overlap with each other with the gate insulating layer positioned therebetween. The source and the drain are electrically connected to the low-resistance regions through openings provided in the insulating layer 315.

The display device 10C illustrated in FIG. 7 has a bottom emission structure.

The display device 10C includes the substrate 361, the insulating layer 367, the transistors 301 and 303, the wiring 307, a conductive layer 355, the insulating layer 314, the light-emitting element 110B, the insulating layer 104, the protective layer 117, the color conversion layer CCMG, the bonding layer 317, the substrate 371, and the like.

In the pixel exhibiting green light, the light-emitting element 110B overlaps with the color conversion layer CCMG with the insulating layer 314 positioned therebetween. The blue light emitted from the light-emitting element 110B is converted into green light by the color conversion layer CCMG so that the green light 106G is extracted to the outside.

Since a color conversion layer is not provided in the pixel exhibiting blue light, the blue light 106B emitted from the light-emitting element 110B is extracted to the outside through the insulating layer 314.

The color conversion layer CCMG can be provided in contact with the top surface of any of a plurality of insulating layers provided between the light-emitting element 110B and the substrate 361. In the case of providing the color conversion layer CCMG over the insulating layer, as compared with the case of bonding the color conversion layer CCMG provided on another substrate, the alignment with the light-emitting region of the light-emitting element becomes easy, which is preferable.

Since the display device 10C has a bottom emission structure, the transistor 303 is provided in a position not overlapping with the light-emitting region of the light-emitting element 110B. The transistor 303 is provided in a position overlapping with the insulating layer 104.

The connection portion 306 includes the wiring 307 and the conductive layer 355. The wiring 307 can be formed using the same material and the same step as those of the sources and the drains of the transistors. The conductive layer 355 can be formed using the same material and the same step as those of the pixel electrode 111. The wiring 307 is electrically connected to an external input terminal through which a signal or a potential from the outside is transmitted to the driver circuit 78. Here, an example in which the FPC 74 is provided as an external input terminal is shown. The FPC 74 and the wiring 307 are electrically connected to each other through the conductive layer 355 and the connector 319.

The display device 10D illustrated in FIG. 8 has a bottom emission structure.

The display device 10D includes the substrate 361, the bonding layer 363, the insulating layer 365, the transistors 301 and 303, the wiring 307, the conductive layer 355, the insulating layer 314, the light-emitting element 110B, the insulating layer 104, the protective layer 117, the color conversion layer CCMG, the partition 107, the bonding layer 317, the substrate 371, and the like.

The display device 10D is formed by transferring the transistor, the light-emitting element, and the like formed over a formation substrate to the substrate 361. The color conversion layer may be formed over the formation substrate as well as the transistor, the light-emitting element, and the like. Alternatively, the color conversion layer may be formed over the substrate 361 in advance, and the color conversion layer may be bonded to a surface that is exposed by separation of the formation substrate. The structure of the display device 10D illustrated in FIG. 8 can be formed by bonding the substrate 361 including the color conversion layer CCMG and the partition 107 to the insulating layer 365 exposed by separation with the use of the bonding layer 363.

In the case of forming the color conversion layer for the substrate 361, the color conversion layer does not affect the layout, structure, characteristics, and the like of the transistor and the light-emitting element; thus, as compared with the case of forming the color conversion layer over the formation substrate, the range of choices for formation methods and formation conditions is widened, which is preferable.

In the pixel exhibiting green light, the light-emitting element 110B overlaps with the color conversion layer CCMG with the insulating layer 314, the bonding layer 363, and the like positioned therebetween. The blue light emitted from the light-emitting element 110B is converted into green light by the color conversion layer CCMG so that the green light 106G is extracted to the outside.

Since a color conversion layer is not provided in the pixel exhibiting blue light, the blue light 106B emitted from the light-emitting element 110B is extracted to the outside through the insulating layer 314, the bonding layer 363, and the like.

[Transistor]

Next, transistors that can be used for the display device are described.

There is no particular limitation on the structure of the transistor in the display device. For example, a planar transistor, a staggered transistor, or an inverted staggered transistor may be used. A top-gate transistor or a bottom-gate transistor may be used. Gate electrodes may be provided above and below a channel.

As the transistor of the display device, a transistor containing metal oxide in a channel formation region can be used, for example. Therefore, a transistor with an extremely low off-state current can be obtained.

Alternatively, as the transistor of the display device, a transistor containing silicon in a channel formation region may be used. Examples of the transistor include a transistor containing amorphous silicon, a transistor containing crystalline silicon (typically, low-temperature polysilicon), and a transistor containing single crystal silicon.

Figure 9A:
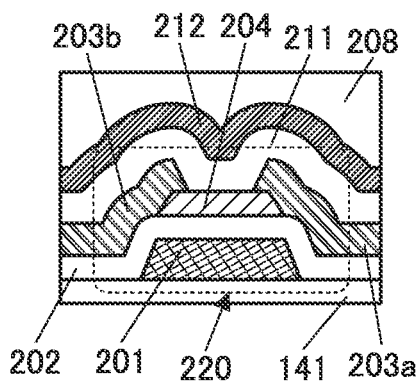
FIG. 9(A) and FIG. 9(B) Cross-sectional views illustrating examples of a transistor.
Figure 9B:
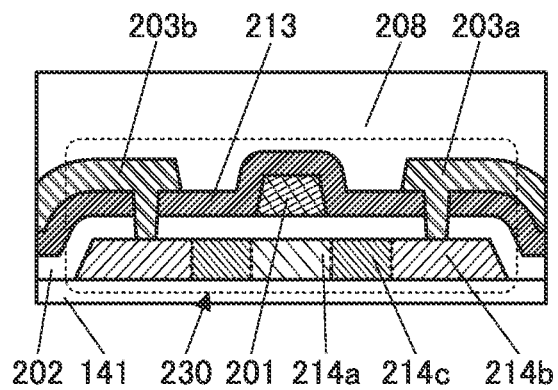

FIG. 9(A) and FIG. 9(B) illustrate structure examples of transistors. Each transistor is provided between an insulating layer 141 and an insulating layer 208. The insulating layer 141 preferably functions as a base film. The insulating layer 208 preferably functions as a planarization film.

A transistor 220 illustrated in FIG. 9(A) is a bottom-gate transistor containing a metal oxide in a semiconductor layer 204. The metal oxide can function as an oxide semiconductor.

An oxide semiconductor is preferably used as the semiconductor of the transistor. The use of a semiconductor material having a wider band gap and a lower carrier density than silicon is preferable because off-state current of the transistor can be reduced.

The transistor 220 includes a conductive layer 201, an insulating layer 202, a conductive layer 203a, a conductive layer 203b, and the semiconductor layer 204. The conductive layer 201 functions as a gate. The insulating layer 202 functions as a gate insulating layer. The semiconductor layer 204 overlaps with the conductive layer 201 with the insulating layer 202 positioned therebetween. The conductive layer 203a and the conductive layer 203b are electrically connected to the semiconductor layer 204. The transistor 220 is preferably covered with an insulating layer 211 and an insulating layer 212. Various inorganic insulating films can be used for the insulating layer 211 and the insulating layer 212. In particular, an oxide insulating film is suitably used for the insulating layer 211, and a nitride insulating film is suitably used for the insulating layer 212.

A transistor 230 illustrated in FIG. 9(B) is a top-gate transistor containing polysilicon in a semiconductor layer.

The transistor 230 includes the conductive layer 201, the insulating layer 202, the conductive layer 203a, the conductive layer 203b, the semiconductor layer, and an insulating layer 213. The conductive layer 201 functions as a gate. The insulating layer 202 functions as a gate insulating layer. The semiconductor layer includes a channel formation region 214a and a pair of low-resistance regions 214b. The semiconductor layer may further include an LDD (Lightly Doped Drain) region. FIG. 9(B) illustrates an example in which an LDD region 214c is provided between the channel formation region 214a and the low-resistance region 214b. The channel formation region 214a overlaps with the conductive layer 201 with the insulating layer 202 provided therebetween. The conductive layer 203a is electrically connected to one of the pair of low-resistance regions 214b through an opening in the insulating layer 202 and the insulating layer 213. Similarly, the conductive layer 203b is electrically connected to the other of the pair of low-resistance regions 214b. Various inorganic insulating films can be used for the insulating layer 213. In particular, a nitride insulating film is suitably used for the insulating layer 213.

[Metal Oxide]

For the semiconductor layer, a metal oxide functioning as an oxide semiconductor is preferably used. A metal oxide that can be used for the semiconductor layer is described below.

A metal oxide preferably contains at least indium or zinc. In particular, indium and zinc are preferably contained. In addition, aluminum, gallium, yttrium, tin, or the like is preferably contained. Furthermore, one or more elements selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide that contains indium, an element M, and zinc is considered. The element M may be aluminum, gallium, yttrium, or tin. Other examples that can be used as the element M include boron, titanium, iron, nickel, germanium, zirconium, molybdenum, lanthanum, cerium, neodymium, hafnium, tantalum, tungsten, and magnesium. Note that two or more of the above elements can be used in combination as the element M in some cases.

Note that in this specification and the like, a metal oxide containing nitrogen is also referred to as a metal oxide in some cases. In addition, a metal oxide containing nitrogen may be referred to as a metal oxynitride. For example, a metal oxide containing nitrogen, such as zinc oxynitride (ZnON), may be used for the semiconductor layer.

Note that the terms "CAAC (c-axis aligned crystal)" and "CAC (Cloud-Aligned Composite)" might appear in this specification and the like. Note that CAAC refers to an example of a crystal structure, and CAC refers to an example of a function or a material composition.

For example, a CAC (Cloud-Aligned Composite)-OS can be used for the semiconductor layer.

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC metal oxide is used for a light-emitting layer of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above conducting function, and the insulating regions have the above insulating function. Furthermore, in some cases, the conductive regions and the insulating regions in the material are separated at the nanoparticle level.

Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow through the component having a narrow gap. Furthermore, the component having a narrow gap complements the component having a wide gap, and carriers also flow through the component having a wide gap in conjunction with the component having a narrow gap. Therefore, in the case where the CAC-OS or the CAC-metal oxide is used for the channel formation region of the transistor, high current drive capability in an on state of the transistor, that is, high on-state current and high field-effect mobility can be obtained.

In other words, the CAC-OS or the CAC-metal oxide can also be referred to as a matrix composite or a metal matrix composite.

Oxide semiconductors (metal oxides) are classified into a single crystal oxide semiconductor and a non-single crystal oxide semiconductor. Examples of a non-single crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of lattice arrangement changes between a region with regular lattice arrangement and another region with regular lattice arrangement in a region where the plurality of nanocrystals are connected.

The nanocrystal is basically a hexagon but is not always a regular hexagon and is a non-regular hexagon in some cases. Furthermore, pentagonal lattice arrangement, heptagonal lattice arrangement, and the like are included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of lattice arrangement. This is because the CAAC-OS can tolerate distortion owing to a low density of oxygen atom arrangement in the a-b plane direction, a change in interatomic bond distance by substitution of a metal element, and the like.

Furthermore, the CAAC-OS tends to have a layered crystal structure (also referred to as a layered structure) in which a layer containing indium and oxygen (hereinafter referred to as an In layer) and a layer containing the element M, zinc, and oxygen (hereinafter referred to as an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can also be referred to as an (In,M) layer.

The CAAC-OS is a metal oxide with high crystallinity. By contrast, in the CAAC-OS, a reduction in electron mobility due to a crystal grain boundary is less likely to occur because it is difficult to observe a clear crystal grain boundary. Entry of impurities, formation of defects, or the like might decrease the crystallinity of a metal oxide. This means that the CAAC-OS has small amounts of impurities and defects (e.g., oxygen vacancies (Vo)). Thus, a metal oxide including the CAAC-OS is physically stable. Accordingly, the metal oxide including the CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on an analysis method.

Note that indium-gallium-zinc oxide (hereinafter referred to as IGZO) that is a kind of metal oxide containing indium, gallium, and zinc has a stable structure in some cases when formed of the nanocrystals. In particular, IGZO crystals tend not to grow in the air and thus, a stable structure is obtained in some cases when IGZO is formed of smaller crystals (e.g., the nanocrystals) rather than larger crystals (here, crystals with a size of several millimeters or several centimeters).

The a-like OS is a metal oxide that has a structure between those of the nc-OS and the amorphous oxide semiconductor. The a-like OS has a void or a low-density region. That is, the a-like OS has lower crystallinity than the nc-OS and the CAAC-OS.

An oxide semiconductor (a metal oxide) has various structures with different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

A metal oxide film that functions as a semiconductor layer can be deposited using either or both of an inert gas and an oxygen gas. Note that there is no particular limitation on the flow rate ratio of oxygen (the partial pressure of oxygen) at the time of deposition of the metal oxide film. However, to obtain a transistor having high field-effect mobility, the flow rate ratio of oxygen (the partial pressure of oxygen) at the time of deposition of the metal oxide film is preferably higher than or equal to 0% and lower than or equal to 30%, further preferably higher than or equal to 5% and lower than or equal to 30%, still further preferably higher than or equal to 7% and lower than or equal to 15%.

The energy gap of the metal oxide is preferably greater than or equal to 2 eV, further preferably greater than or equal to 2.5 eV, still further preferably greater than or equal to 3 eV. With the use of a metal oxide having such a wide energy gap, the off-state current of the transistor can be reduced.

The metal oxide film can be formed by a sputtering method. Alternatively, a PLD method, a PECVD method, a thermal CVD method, an ALD method, a vacuum evaporation method, or the like may be used.

As materials that can be used for the conductive layers included in the display device, any of metals such as aluminum, titanium, chromium, nickel, copper, yttrium, zirconium, molybdenum, silver, tantalum, and tungsten, an alloy containing any of these metals as its main component, or the like can be used. A single layer structure or a stacked-layer structure including a film containing any of these materials can be used. For example, the following structures can be used: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because controllability of the shape by etching is increased.

Examples of a material that can be used for the insulating layers included in the display device include resin such as acrylic resin, a polyimide resin, an epoxy resin, or a silicone resin, and an inorganic insulating material such as silicon oxide, silicon oxynitride, silicon nitride oxide, silicon nitride, or aluminum oxide.

As described above, in the display device of this embodiment, the blue light-emitting element and the color conversion layer are combined, and thus full-color display is possible. The number of layers included in the light-emitting element can be reduced, and thus a manufacturing apparatus and steps can be simplified. The display device of this embodiment can supply, in addition to an image signal corresponding to image data, a signal corresponding to data for correction (correction signal) to the pixel. Accordingly, desired display can be performed without image data conversion.

This embodiment can be combined with any of the other embodiments as appropriate. In this specification, in the case where a plurality of structure examples are shown in one embodiment, the structure examples can be combined as appropriate.

Embodiment 2

In this embodiment, a pixel circuit included in a display device of one embodiment of the present invention is described below with reference to FIG. 10 to FIG. 16.

[Display Device]

Figure 10A:
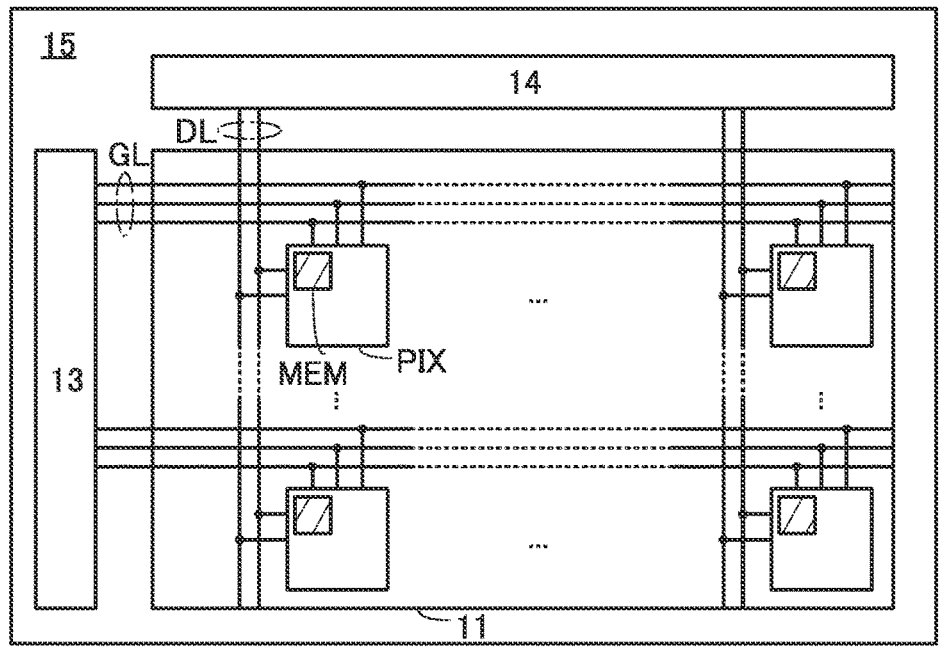
FIG. 10(A) A block diagram illustrating an example of a pixel.

FIG. 10(A) illustrates a block diagram of a display device 15. The display device 15 includes a display portion 11 including a plurality of pixels PIX, a gate driver 13, and a source driver 14.

The pixel PIX includes at least one memory circuit MEM. The memory circuit MEM can retain a potential of at least one storage node. The memory circuit MEM may be able to retain potentials of a plurality of storage nodes that are connected in series or in parallel. Although not illustrated in FIG. 10(A), the pixel PIX includes a display element (in this embodiment, a light-emitting element), a transistor for driving the display element, and the like. The pixel PIX is supplied with a signal from the gate driver 13 through a plurality of wirings GL, and the driving of the pixel PIX is controlled. The pixel PIX is supplied with a signal from the source driver 14 through a plurality of wirings DL, and the driving of the pixel PIX is controlled.

The plurality of wirings GL functions as a scan line. The signal transmitted by the wiring GL functions as a scan signal (also referred to as a control signal). The scan signal is a signal for controlling the conduction or non-conduction (on or off) of the transistor functioning as a switch in the pixel PIX. The signal transmitted by the wiring GL is output from the gate driver 13.

The plurality of wirings DL functions as a data line. The signal transmitted by the wiring DL functions as a data signal. The data signal is also referred to as data, image data, or an image signal. The data signal is a signal for displaying an image. The data signal includes a signal retained in the memory circuit MEM and a signal that is supplied later while the signal is retained in the memory circuit MEM. The wiring DL functions as a wiring for applying a voltage required for driving of the pixel PIX, for example, a reference voltage. The signal transmitted by the wiring DL is output from the source driver 14.

The memory circuit MEM includes a capacitor and transistors. The memory circuit MEM has a function of retaining a signal supplied through the wiring DL as an electric charge (potential) in the capacitor. The memory circuit MEM has a function of retaining a voltage that is made by adding a potential of a signal written later to a retained potential by supplying another signal through the wiring DL. Specifically, the sum of signals can be performed using capacitive coupling in the capacitor. Note that the operation in which the memory circuit MEM retains a signal supplied through the wiring DL as an electric charge in the capacitor is also referred to as "a signal is retained".

In the display device of this embodiment, the pixel PIX includes the memory circuit MEM, and thus image data can be corrected in the pixel PIX.

[Structure Example 1 of Pixel Circuit]

Figure 10B:
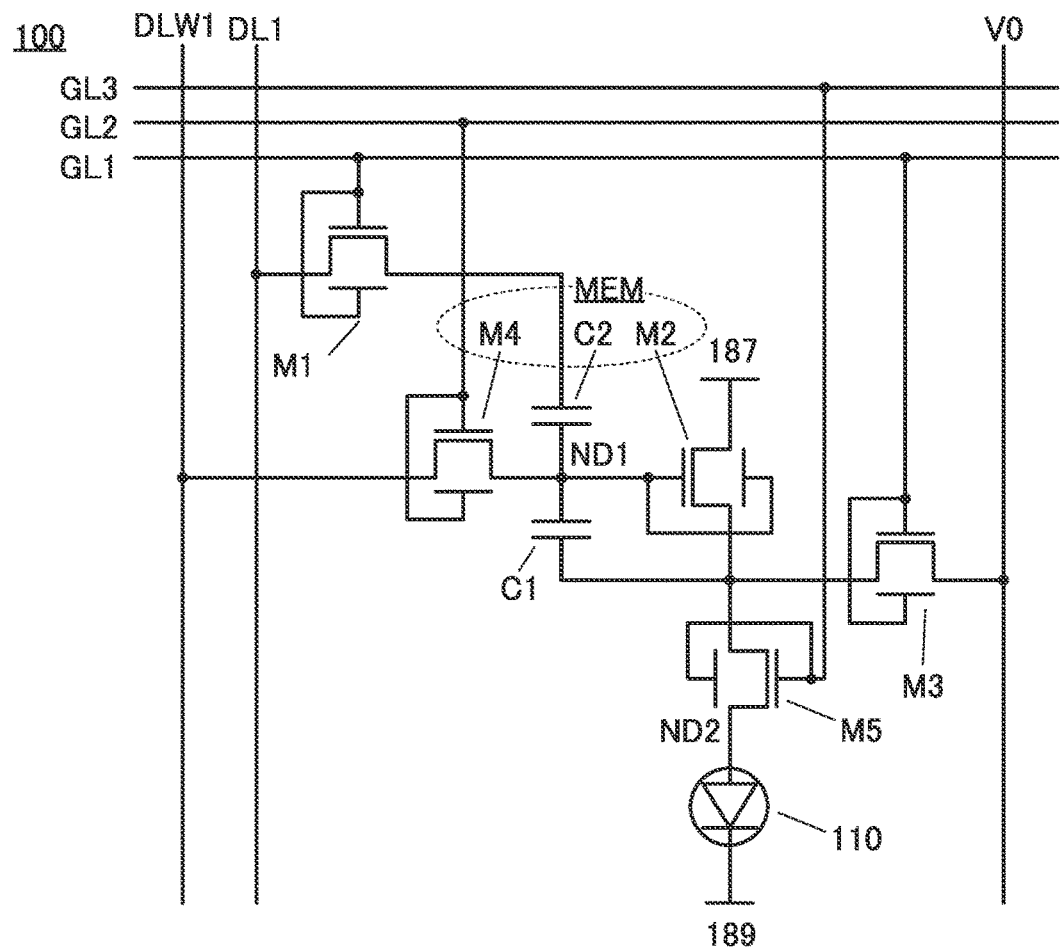
FIG. 10(B) A circuit diagram illustrating an example of a pixel.

A pixel 100 illustrated in FIG. 10(B) includes a transistor M1, a transistor M2, a transistor M3, a transistor M4, a transistor M5, a capacitor C1, a capacitor C2, and a light-emitting element 110.

One of a source and a drain of the transistor M1 is electrically connected to one electrode of the capacitor C2. The other electrode of the capacitor C2 is electrically connected to one of a source and a drain of the transistor M4. The one of the source and the drain of the transistor M4 is electrically connected to a gate of the transistor M2. The gate of the transistor M2 is electrically connected to one electrode of the capacitor C1. The other electrode of the capacitor C1 is electrically connected to one of a source and a drain of the transistor M2. The one of the source and the drain of the transistor M2 is electrically connected to one of a source and a drain of the transistor M5. The one of the source and the drain of the transistor M5 is electrically connected to one of a source and a drain of the transistor M3. The other of the source and the drain of the transistor M5 is electrically connected to one electrode of the light-emitting element 110. Although each of the transistors illustrated in FIG. 10(B) includes a back gate electrically connected to the gate, the presence or absence of the back gate of the transistor and the connection of the back gate are not particularly limited in the display device of this embodiment.

Here, a node to which the other electrode of the capacitor C2, the one of the source and the drain of the transistor M4, the gate of the transistor M2, and the one electrode of the capacitor C1 are connected is referred to as a node ND1. A node to which the other of the source and the drain of the transistor M5 and the one electrode of the light-emitting element 110 are connected is referred to as a node ND2.

The gate of the transistor M1 is electrically connected to a wiring GL1. The gate of the transistor M3 is electrically connected to the wiring GL1. A gate of the transistor M4 is electrically connected to a wiring GL2. A gate of the transistor M5 is electrically connected to a wiring GL3. The other of the source and the drain of the transistor M1 is electrically connected to a wiring DL1. The other of the source and the drain of the transistor M3 is electrically connected to a wiring V0. The other of the source and the drain of the transistor M4 is electrically connected to a wiring DLW1.

The other of the source and the drain of the transistor M2 is electrically connected to a power supply line 187 (at high potential). The other electrode of the light-emitting element 110 is electrically connected to a common wiring 189. Note that a given potential can be supplied to the common wiring 189.

The wirings GL1, GL2, and GL3 can function as a signal line for controlling the operation of the corresponding transistor. The wiring DL1 can function as a signal line for supplying an image signal to the pixel. The wiring DLW1 can function as a signal line for writing data to the memory circuit MEM. The wiring DLW1 can function as a signal line for supplying a correction signal to the pixel. The wiring V0 functions as a monitor line for obtaining the electrical characteristics of the transistor M4. A specific potential is supplied from the wiring V0 to the one electrode of the capacitor C1 through the transistor M3, whereby writing of an image signal can be stable.

The memory circuit MEM is formed of the transistors M2, the transistor M4, and the capacitor C2. The node ND1 is a storage node; when the transistor M4 is turned on, a signal supplied to the wiring DLW1 can be written to the node ND1. The use of a transistor with an extremely low off-state current as the transistor M4 allows the potential of the node ND1 to be retained for a long time.

As the transistor M4, a transistor containing a metal oxide in its channel formation region (hereinafter referred to as an OS transistor) can be used, for example. Thus, the off-state current of the transistor M4 can be extremely low, and the potential of the node ND1 can be retained for a long time. In this case, OS transistors are preferably used as the other transistors included in the pixel. For the specific example of the metal oxide, Embodiment 1 can be referred to. A CAAC-OS has a crystal structure including stable atoms and is suitable for a transistor that is required to have high reliability, and the like. A CAC-OS has high mobility and is suitable for a transistor that operates at high speed, and the like.

An OS transistor has a large energy gap and thus has an extremely low off-state current. Unlike in a transistor in which Si is included in the channel formation region (hereinafter referred to as a Si transistor), impact ionization, avalanche breakdown, short-channel effects, and the like do not occur in an OS transistor; accordingly, a highly reliable circuit can be configured.

Furthermore, a Si transistor may be used as the transistor M4. In this case, Si transistors are preferably used as the other transistors included in the pixel.

Examples of the Si transistor include a transistor containing amorphous silicon, a transistor containing crystalline silicon (typically, low-temperature polysilicon), and a transistor containing single crystal silicon.

Alternatively, one pixel may include both an OS transistor and a Si transistor.

In the pixel, a signal written to the node ND1 is capacitively coupled to an image signal supplied from the wiring DL1, and the resulting data can be output to the node ND2. Note that the transistor M1 can have a function of selecting a pixel. The transistor M5 can function as a switch that controls light emission of the light-emitting element 110.

For example, when the signal written to the node ND1 from the wiring DLW1 is higher than the threshold voltage ($V_{th}$) of the transistor M2, the transistor M2 is turned on, and the light-emitting element 110 emits light before the image signal is written. For this reason, it is preferable that the transistor M5 be provided and that after the potential of the node ND1 is fixed, the transistor M5 be turned on so that the light-emitting element 110 emits light.

In other words, when an intended correction signal is stored in the node ND1 in advance, the correction signal can be added to the supplied image signal. Note that the correction signal is sometimes attenuated by a component on the transmission path; hence, the signal is preferably produced in consideration of the attenuation.

Figure 11A:
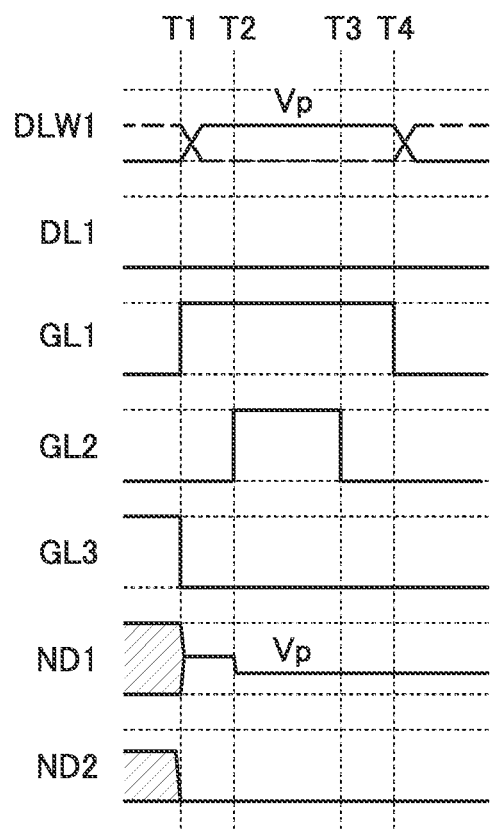
FIG. 11(A) and FIG. 11(B) Timing charts showing operation examples of a pixel.
Figure 11B:
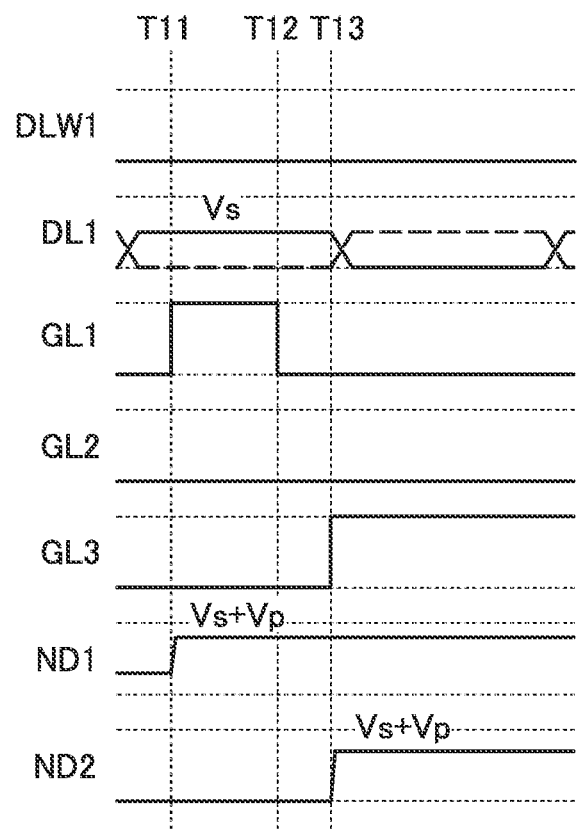

The details of the operation of the pixel 100 in FIG. 10(B) are described using timing charts shown in FIG. 11(A) and FIG. 11(B). Note that although a given positive or negative signal can be used as the correction signal (Vp) supplied to the wiring DLW1, the case where a positive signal is supplied is described here. In the following description and the timing charts, "H" represents high potential and "L" represents low potential. Note that ideal operations are described in this embodiment, and in potential distribution, potential coupling, or potential loss, detailed potential changes due to a circuit configuration, operation timing, or the like are not considered.

First, the operation of writing the correction signal (Vp) to the node ND1 is described with reference to FIG. 11(A). The operation may be performed for every frame, and writing is performed at least once before the image signal is supplied. Furthermore, refresh operation is performed as appropriate to rewrite the same correction signal to the node ND1.

At Time T1, the potential of the wiring GL1 is set to "H", the potential of the wiring GL2 is set to "L", the potential of the wiring GL3 is set to "L", and the potential of the wiring DL1 is set to "L"; accordingly, the transistor M1 is turned on and the potential of the other electrode of the capacitor C2 becomes "L".

This operation is reset operation for capacitive coupling operation that is to be performed later. Before Time T1, the light-emitting element 110 emits light in the previous frame; however, the reset operation changes the potential of the node ND1, thereby changing the amount of current flowing through the light-emitting element 110. Thus, the transistor M5 is preferably turned off to stop light emission of the light-emitting element 110.

At Time T2, the potential of the wiring GL1 is set to "H", the potential of the wiring GL2 is set to "H", the potential of the wiring GL3 is set to "L", and the potential of the wiring DL1 is set to "L"; accordingly, the transistor M4 is turned on, and the potential of the wiring DLW1 (the correction signal (Vp)) is written to the node ND1.

At Time T3, the potential of the wiring GL1 is set to "H", the potential of the wiring GL2 is set to "L", the potential of the wiring GL3 is set to "L", and the potential of the wiring DL1 is set to "L"; accordingly, the transistor M4 is turned off and the correction signal (Vp) is retained in the node ND1.

At Time T4, the potential of the wiring GL1 is set to "L", the potential of the wiring GL2 is set to "L", the potential of the wiring GL3 is set to "L", and the potential of the wiring DL1 is set to "L"; accordingly, the transistor M1 is turned off and the operation of writing the correction signal (Vp) is finished.

Next, the operation of correcting the image signal (Vs) and operation of making the light-emitting element 110 emit light are described with reference to FIG. 11(B).

At Time T11, the potential of the wiring GL1 is set to "H", the potential of the wiring GL2 is set to "L", the potential of the wiring GL3 is set to "L", and the potential of the wiring DLW1 is set to "L"; accordingly, the transistor M1 is turned on, and the potential of the wiring DL1 is added to the potential of the node ND1 by capacitive coupling through the capacitor C2. That is, the potential of the node ND1 becomes a potential (Vs+Vp) obtained by adding the correction signal (Vp) to the image signal (Vs).

At Time T12, the potential of the wiring GL1 is set to "L", the potential of the wiring GL2 is set to "L", the potential of the wiring GL3 is set to "L", and the potential of the wiring DLW1 is set to "L"; accordingly, the transistor M1 is turned off, and the potential of the node ND1 is fixed to Vs+Vp.

At Time T13, the potential of the wiring GL1 is set to "L", the potential of the wiring GL2 is set to "L", the potential of the wiring GL3 is set to "H", and the potential of the wiring DLW1 is set to "L"; accordingly, the transistor M5 is turned on, the potential of the node ND2 becomes Vs+Vp, and the light-emitting element 110 emits light. Strictly speaking, the potential of the node ND2 is lower than Vs+Vp by the threshold voltage ($V_{th}$) of the transistor M2; here, $V_{th}$ is adequately low and negligible.

The operation of correcting the image signal (Vs) and the operation of making the light-emitting element 110 emit light are described above. Note that the aforementioned operation of writing the correction signal (Vp) and the operation of inputting the image signal (Vs) may be successively performed; however, it is preferable to perform the operation of inputting the image signal (Vs) after the correction signal (Vp) is written to all pixels. In one embodiment of the present invention, since the same image signal can be supplied to a plurality of pixels at the same time, the correction signal (Vp) is written to all the pixels first, whereby the operating speed can be increased.

[Structure Example 2 of Pixel Circuit]

Next, a pixel circuit in which a plurality of storage nodes are provided in series is described. In the pixel circuit, a light-emitting element can be operated in accordance with the sum of a plurality of input data.

Figure 12A:
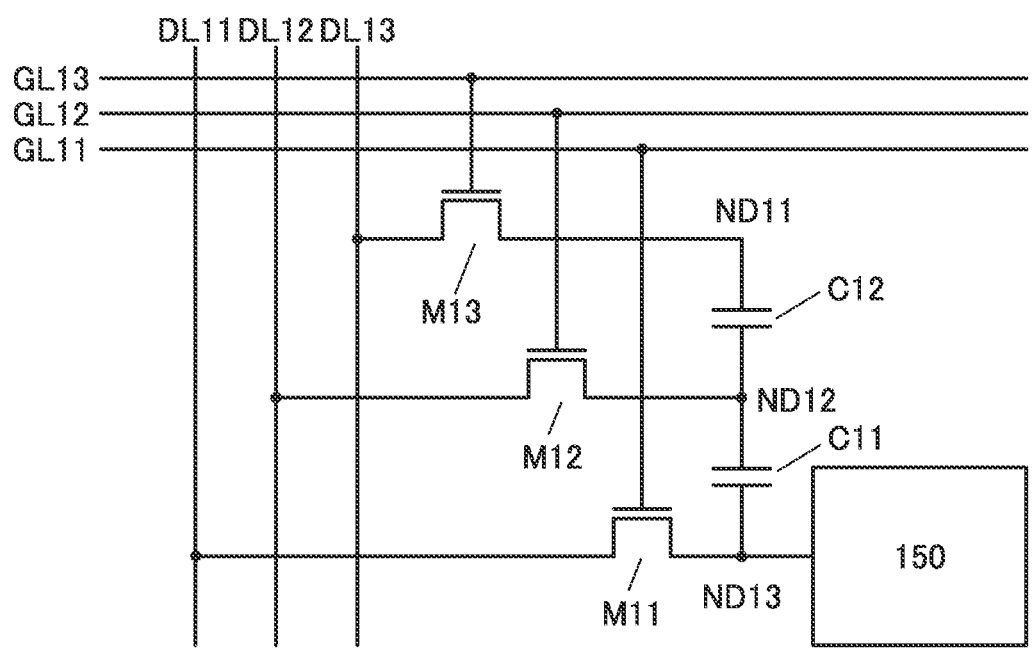
FIG. 12(A) and FIG. 12(B) Circuit diagrams showing examples of a pixel.

A pixel 101 illustrated in FIG. 12(A) includes two capacitors, and by capacitive coupling, display can be performed in accordance with the sum of at most three data.

Figure 12B:
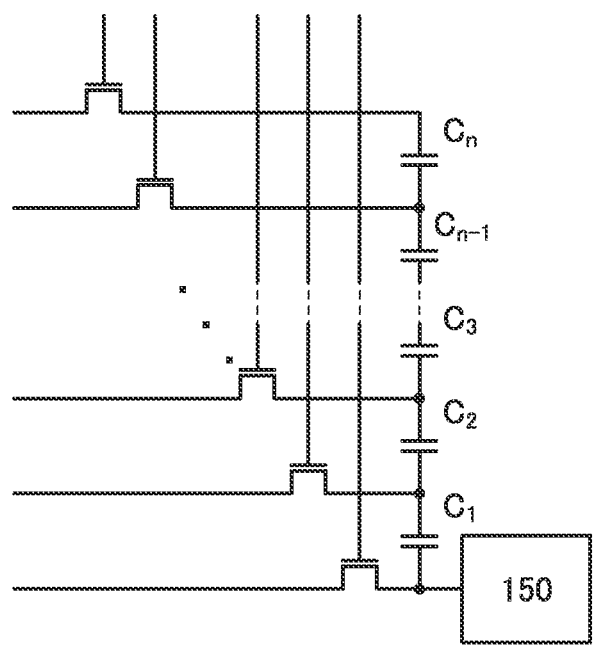

Although the configuration in which two capacitors are connected in series is shown in FIG. 12(A), a greater number of capacitors $C_1$ to $C_n$ may be connected in series as illustrated in FIG. 12(B). At that time, when one capacitor is added, one transistor is also added. One of a source and a drain of the transistor is electrically connected to a wiring that connects one capacitor and another capacitor. That is, the number of nodes such as the node ND12 is increased.

The number n of capacitors connected in series is preferably greater than or equal to 2 and less than or equal to 8, further preferably greater than or equal to 2 and less than or equal to 6, still further preferably greater than or equal to 2 and less than or equal to 4. The greater the number of capacitors is, the more the effect of one embodiment of the present invention is increased. However, with the increase of the capacitors, the transistors and the signal lines are also increased, which may have harmful effects such that the aperture ratio of the pixel is lowered, the resolution becomes low, and the time for inputting signals is not ensured. Thus, the number n of capacitors connected in series is preferably selected from the above range in accordance with the intended use.

The pixel 101 illustrated in FIG. 12(A) includes a transistor M11, a transistor M12, a transistor M13, a capacitor C11, a capacitor C12, and a circuit block 150. The circuit block 150 can include a transistor, a capacitor, a light-emitting element, and the like. The details of the circuit block 150 is described later.

One of a source and a drain of the transistor M11 is electrically connected to the one electrode of the capacitor C11. The one electrode of the capacitor C11 is electrically connected to the circuit block 150. The other electrode of the capacitor C11 is electrically connected to one of a source and a drain of the transistor M12. The one of the source and the drain of the transistor M12 is electrically connected to one electrode of the capacitor C12. The other electrode of the capacitor C12 is electrically connected to one of a source and a drain of the transistor M13.

Here, a node ND13 refers to a wiring to which the one of the source and the drain of the transistor M11, the one electrode of the capacitor C11, and the circuit block 150 are connected. Note that the component of the circuit block 150 connected to the node ND13 can make the node ND13 floating. Anode ND12 refers to a wiring to which the other electrode of the capacitor C11, the one of the source and the drain of the transistor M12, and the one electrode of the capacitor C12 are connected. Anode ND11 refers to a wiring to which the one of the source and the drain of the transistor M13 and the other electrode of the capacitor C12 are connected.

A gate of the transistor M11 is electrically connected to a wiring GL11. A gate of the transistor M12 is electrically connected to a wiring GL12. A gate of the transistor M13 is electrically connected to a wiring GL13. The other of the source and the drain of the transistor M11 is electrically connected to a wiring DL11. The other of the source and the drain of the transistor M12 is electrically connected to a wiring DL12. The other of the source and the drain of the transistor M13 is electrically connected to a wiring DL13.

The wirings GL11, GL12, and GL13 can function as a signal line for controlling the operation of the transistor. The wiring DL11 can function as a signal line for supplying first data. The wiring DL12 can function as a signal line for supplying second data. The wiring DL13 can function as a signal line for supplying third data.

The node ND11, the node ND12, and the node ND13 are storage nodes. When the transistor M11 is turned on, the first data supplied to the wiring DL11 can be written to the node ND13. When the transistor M11 is turned off, the first data can be retained in the node ND13. When the transistor M12 is turned on, the second data supplied to the wiring DL12 can be written to the node ND12. When the transistor M12 is turned off, the second data can be retained in the node ND12. When the transistor M13 is turned on, the third data supplied to the wiring DL13 can be written to the node ND11. When the transistor M13 is turned off, the third data can be retained in the node ND11.

The use of a transistor with an extremely low off-state current as the transistors M11, M12, and M13 allows the potentials of the node ND13 and the node ND12 to be retained for a long time. An OS transistor can be used as the transistor.

Note that an OS transistor may also be used as the other transistor included in the pixel. Furthermore, a Si transistor may be used as the transistor included in the pixel. Both an OS transistor and a Si transistor may be used.

With reference to the timing charts illustrated in FIG. 13(A), FIG. 13(B), and FIG. 13(C), an example of operation of the pixel 101 in which the second data and the third data are added to the first data is described. Note that in the following description, "$V_{data1}$" represents the first data, "$V_{data2}$" represents the second data, and "$V_{data3}$" represents the third data. Furthermore, "$V_{ref}$" represents one reference potential (e.g., 0V, a GND potential, or a particular potential). Note that each of the first data, the second data, and the third data may be a negative value to be used for subtraction.

First, the operation of writing the first data "$V_{data1}$" to the node ND13 is described with reference to FIG. 13(A).

At Time T1, the potential of the wiring GL11 is set to "H", the potential of the wiring GL12 is set to "H", the potential of the wiring DL11 is set to "$V_{data1}$", and the potential of the wiring DL12 is set to "$V_{ref}$"; accordingly, the transistor M12 is turned on, and the potential of the node ND12 becomes "$V_{ref}$". This operation is reset operation for capacitive coupling operation that is to be performed later.

Furthermore, the transistor M11 is turned on, and thus the potential (first data "$V_{data1}$") of the wiring DL11 is written to the node ND13.

At Time T2, the potential of the wiring GL11 is set to "L" and the potential of the wiring GL12 is set to "L"; accordingly, the transistor M11 and the transistor M12 are turned off, and the first data "$V_{data1}$" is retained in the node ND13. In addition, "$V_{data1}-V_{ref}$" is retained in the capacitor C11.

The operation of writing the first data "$V_{data1}$" has been described so far. Note that in the case where the first data is not reflected on display, a potential that is equal to "$V_{ref}$" may be supplied as the first data "$V_{data1}$".

Next, the operation of writing the second data "$V_{data2}$" to the node ND12 is described with reference to FIG. 13(B).

At Time T11, the potential of the wiring GL12 is set to "H", the potential of the wiring GL13 is set to "H", the potential of the wiring DL12 is set to "$V_{data2}$", and the potential of the wiring DL13 is set to "$V_{ref}$"; accordingly, the transistor M13 is turned on, and the potential of the node ND11 becomes "$V_{ref}$". This operation is reset operation for capacitive coupling operation that is to be performed later.

Furthermore, the transistor M12 is turned on, and the potential (second data "$V_{data2}$") of the wiring DL12 is written to the node ND12.

At this time, the potential of the node ND12 is added to the potential of the node ND13 by capacitive coupling of the capacitor C11. Thus, the potential of the node ND13 becomes "$V_{data1}-V_{ref}+V_{data2}$", and if "$V_{ref}$"=0, the potential of the node ND13 becomes "$V_{data1}+V_{data2}$".

At Time T12, the potential of the wiring GL12 is set to "L" and the potential of the wiring GL13 is set to "L"; accordingly, the transistor M12 is turned off, and the second data "$V_{data2}$" is retained in the node ND12. The sum of the first data and the second data "$V_{data1}+V_{data2}$" is retained in the node ND13. In addition, "$V_{data2}-V_{ref}$" is retained in the capacitor C12.

The operation of writing the second data "$V_{data2}$" has been described so far. Note that in the case where the second data is not reflected on display, a potential that is equal to "$V_{ref}$" may be supplied as the second data "$V_{data2}$".

Next, the operation of writing the third data "$V_{data3}$" is described with reference to FIG. 13(C).

At Time T21, the potential of the wiring GL13 is set to "H" and the potential of the wiring DL13 is set to "$V_{data3}$"; accordingly, the transistor M13 is turned on, and the potential of the node ND11 becomes "$V_{data3}$".

At this time, the potential of the node ND11 is added to the potential of the node ND12 by capacitive coupling of the capacitor C12. Thus, the potential of the node ND12 becomes "$V_{data2}-V_{ref}+V_{data3}$", and if "$V_{ref}$"=0, the potential of the node ND12 becomes "$V_{data2}+V_{data3}$".

Moreover, the potential of the node ND12 is added to the potential of the node ND13 by capacitive coupling of the capacitor C11. Thus, the potential of the node ND12 becomes "$V_{data1}+V_{data2}+V_{data3}$".

At Time T22, the potential of the wiring GL13 is set to "L"; accordingly, the transistor M13 is turned off, and the potential of the node ND13 is retained at "$V_{data1}+V_{data2}+V_{data3}$".

Accordingly, the writing operation of the first data "$V_{data1}$", the second data "$V_{data2}$", and the third data "$V_{data3}$" is completed. Note that in the case where the third data is not reflected on display, a potential that is equal to "$V_{ref}$" may be supplied as the third data "$V_{data3}$". Alternatively, the writing operation of the third data may be omitted.

After that, the light-emitting element included in the circuit block 150 performs display operation in accordance with the potential of the node ND13. Note that depending on the configuration of the circuit block, the display operation starts at Time T1 or Time T11 in some cases.

Figure 14A:
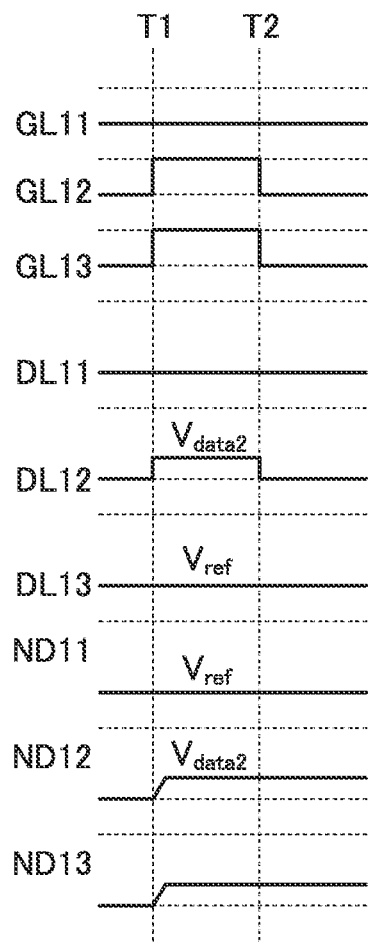
FIG. 14(A) to FIG. 14(C) Timing charts showing operation examples of a pixel.
Figure 14B:
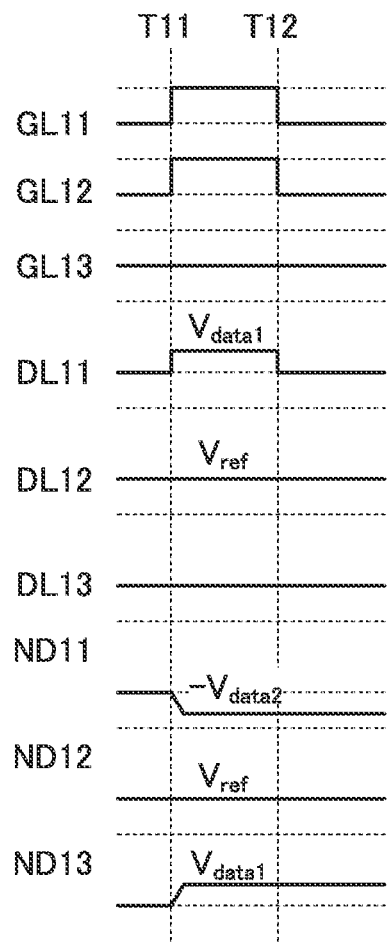
Figure 14C:
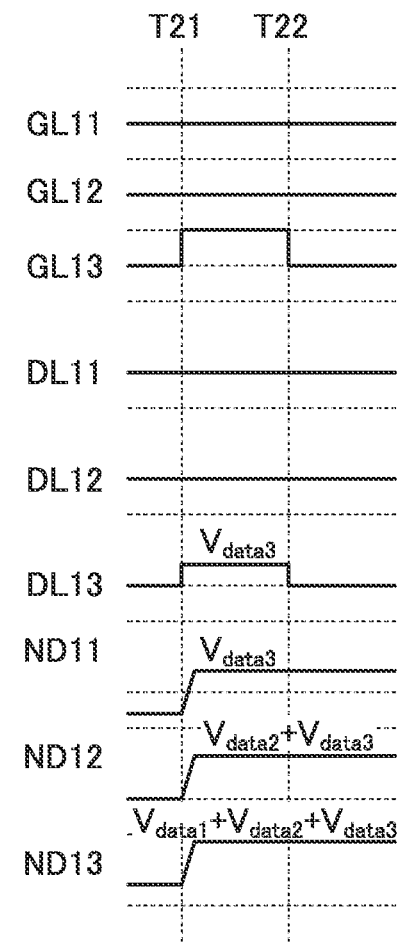

As illustrated in FIG. 14(A), FIG. 14(B), and FIG. 14(C), the order of the operation shown in FIG. 13(A) and the operation shown in FIG. 13(B) may be changed.

Next, the operation of writing the first data "$V_{data2}$" to the node ND12 is described with reference to FIG. 14(A).

At Time T1, the potential of the wiring GL12 is set to "H", the potential of the wiring GL13 is set to "H", the potential of the wiring DL12 is set to "$V_{data2}$", and the potential of the wiring DL13 is set to "$V_{ref}$"; accordingly, the transistor M13 is turned on, and the potential of the node ND11 becomes "$V_{ref}$". Furthermore, the transistor M12 is turned on, and the potential (second data "$V_{data2}$") of the wiring DL12 is written to the node ND12.

At Time T2, the potential of the wiring GL12 is set to "L" and the potential of the wiring GL13 is set to "L"; accordingly, the transistor M12 and the transistor M13 are turned off, and the second data "$V_{data2}$" is retained in the node ND12. In addition, "$V_{data2}-V_{ref}$" is retained in the capacitor C12.

Next, the operation of writing the first data "$V_{data1}$" to the node ND13 is described with reference to FIG. 14(B).

At Time T11, the potential of the wiring GL11 is set to "H", the potential of the wiring GL12 is set to "H", the potential of the wiring DL11 is set to "$V_{data1}$", and the potential of the wiring DL12 is set to "$V_{ref}$"; accordingly, the transistor M12 is turned on, and the potential of the node ND12 becomes "$V_{ref}$". Furthermore, the transistor M11 is turned on, and the potential (first data "$V_{data1}$") of the wiring DL11 is written to the node ND13.

At Time T12, the potential of the wiring GL11 is set to "L" and the potential of the wiring GL12 is set to "L"; accordingly, the transistor M12 is turned off, and "$V_{ref}$" is retained in the node ND12. The first data "$V_{data1}$" is retained in the node ND13. In addition, "$V_{data2}-V_{ref}$" is retained in the capacitor C12, and thus if "$V_{ref}$"=0, the potential of the node ND11 becomes "$-V_{data2}$".

Next, the operation of writing the third data "$V_{data3}$" is described with reference to FIG. 14(C).

At Time T21, the potential of the wiring GL13 is set to "H" and the potential of the wiring DL13 is set to "$V_{data3}$"; accordingly, the transistor M13 is turned on, and the potential of the node ND11 becomes "$V_{data3}$".

At this time, the potential of the node ND11 is added to the potential of the node ND12 by capacitive coupling of the capacitor C12. Thus, the potential of the node ND12 becomes "$V_{data3}-(-V_{data2})+V_{ref}$", and if "$V_{ref}$"=0, the potential of the node ND12 becomes "$V_{data2}+V_{data3}$".

Moreover, the potential of the node ND12 is added to the potential of the node ND13 by capacitive coupling of the capacitor C11. Thus, the potential of the node ND12 becomes "$V_{data1}+V_{data2}+V_{data3}$".

At Time T22, the potential of the wiring GL13 is set to "L"; accordingly, the transistor M13 is turned off, and the potential of the node ND13 is retained at "$V_{data1}+V_{data2}+V_{data3}$".

Accordingly, the writing operation of the first data "$V_{data1}$", the second data "$V_{data2}$", and the third data "$V_{data3}$" is completed.

The operations in FIG. 13(A), FIG. 13(B), and FIG. 13(C) can be sequentially performed in one horizontal period. Alternatively, the operation in FIG. 13(A) may be performed in a k-th frame (k is a natural number) and the operations in FIG. 13(B) and FIG. 13(C) may be performed in a (k+1)-th frame. Alternatively, the operations in FIG. 13(A) and FIG. 13(B) may be performed in the k-th frame and the operation in FIG. 13(C) may be performed in the (k+1)-th frame. Alternatively, the operations in FIG. 13(A), FIG. 13(B), and FIG. 13(C) may be performed in subsequent different frames. Alternatively, the operation in FIG. 13(A) may be performed in the k-th frame, and the operations in FIG. 13(B) and FIG. 13(C) may be performed repeatedly in and after the (k+1)-th frame. Alternatively, the operations in FIG. 13(A) and FIG. 13(B) may be performed in the k-th frame, and the operation in FIG. 13(C) may be performed repeatedly in and after the (k+1)-th frame. Note that the operations in FIG. 14(A), FIG. 14(B), FIG. 14(C) can also be performed in a similar manner.

FIG. 15(A) to FIG. 15(C) illustrate specific examples of the circuit block 150.

The circuit block 150 illustrated in FIG. 15(A) includes a transistor 171, a capacitor 173, and the light-emitting element 110. One of a source and a drain of the transistor 171 is electrically connected to one electrode of the light-emitting element 110. The one electrode of the light-emitting element 110 is electrically connected to one electrode of the capacitor 173. The other electrode of the capacitor 173 is electrically connected to a gate of the transistor 171. The gate of the transistor 171 is electrically connected to the node ND13.

The other of the source and the drain of the transistor 171 is electrically connected to a power supply line 187 (at high potential). The other electrode of the light-emitting element 110 is electrically connected to the common wiring 189. Note that a given potential can be supplied to the common wiring 189.

In the configuration illustrated in FIG. 15(A), a current flows through the light-emitting element 110 when the potential of the node ND13 is equal to or exceeds the threshold voltage of the transistor 171. Therefore, in some cases, the Light-emitting element 110 starts to emit light at Time T1 shown in the timing charts of FIG. 13(A) and FIG. 14(A); this might limit the applications.

FIG. 15(B) shows a structure in which a transistor 172 is added to the structure that is shown in FIG. 15(A). One of a source and a drain of the transistor 172 is electrically connected to the one of the source and the drain of the transistor 171. The other of the source and the drain of the transistor 172 is electrically connected to the light-emitting element 110. A gate of the transistor 172 is electrically connected to a wiring 186. The wiring 186 can have a function of a signal line controlling the conduction of the transistor 172.

In this configuration, a current flows through the light-emitting element 110 when the transistor 172 is turned on and the potential of the node ND13 is equal to or exceeds the threshold voltage of the transistor 171. Therefore, the Light-emitting element 110 can start to emit light at or after Time T22 in the timing charts of FIG. 13(C) and FIG. 14(C); this is suitable for operation involving correction.

FIG. 15(C) shows a structure in which a transistor 175 is added to the structure that is shown in FIG. 15(B). One of a source and a drain of the transistor 175 is electrically connected to the one of the source and the drain of the transistor 171. The other of the source and the drain of the transistor 175 is electrically connected to a wiring 190. A gate of the transistor 175 is electrically connected to a wiring 191. The wiring 191 can have a function of a signal line controlling the conduction of the transistor 175. Note that the gate of the transistor 175 may be electrically connected to the wiring GL13.

The wiring 190 can be electrically connected to a supply source of a certain potential such as a reference potential. The certain potential is supplied from the wiring 190 to the one of the source and the drain of the transistor 171, whereby writing of the image data can be stable.

In addition, the wiring 190 can be connected to the circuit 120 and can also function as a monitor line. The circuit 120 can have one or more of the functions of supplying the above certain potential, obtaining electrical characteristics of the transistor 171, and generating correction data.

In the case where the wiring 190 functions as a monitor line, the circuit 120 is capable of generating a potential correcting the threshold voltage of the transistor 171 as data written to the node ND13.

Next, the correction operation of image data is described with reference to FIG. 16(A) and FIG. 16(B).

Figure 16A:
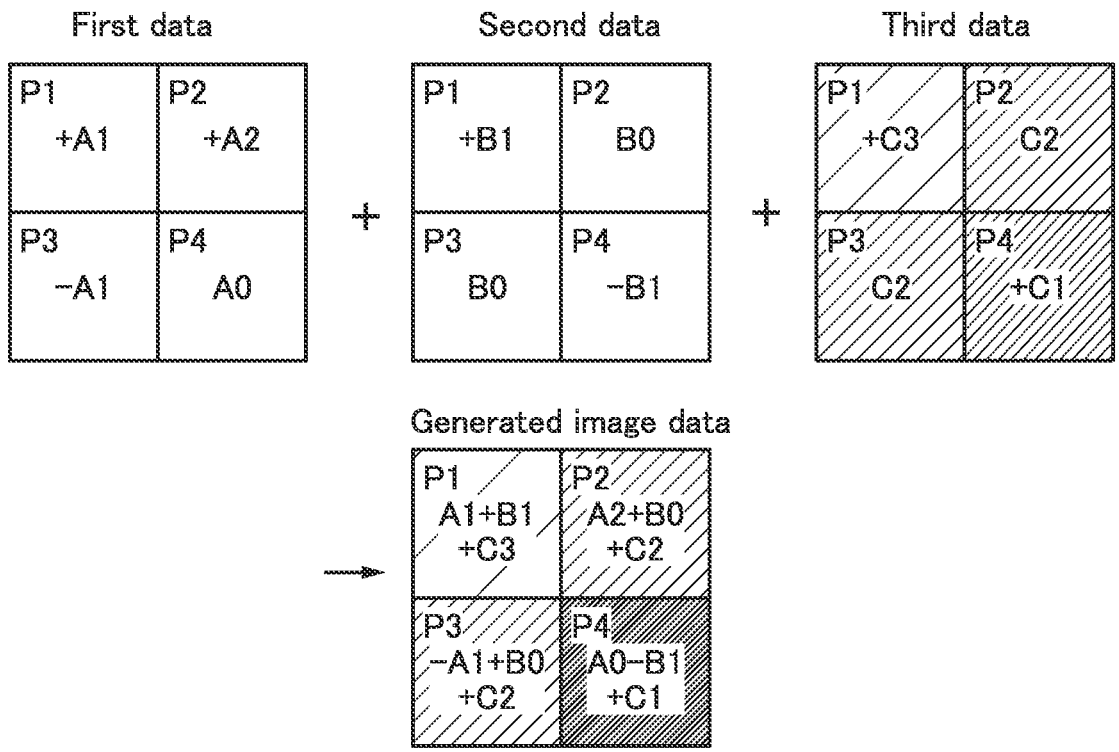
FIG. 16(A) and FIG. 16(B) Diagrams illustrating correction of image data and synthesis of images.
Figure 16B:
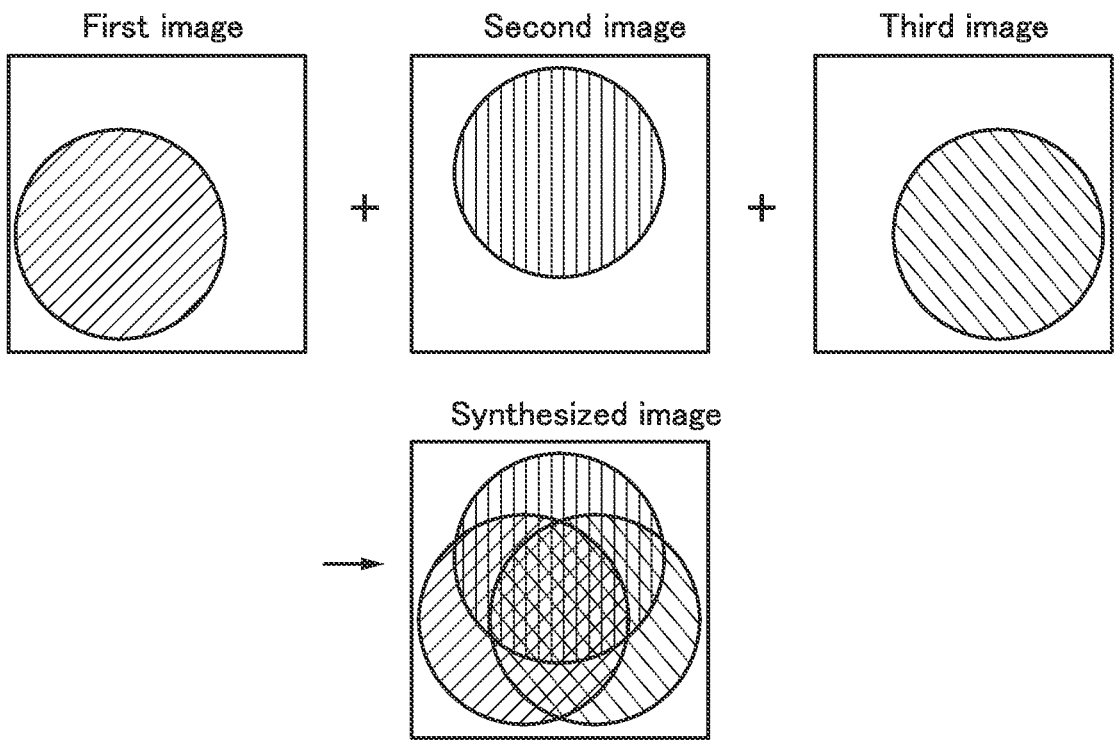

FIG. 16(A) illustrates an example of data potentials input to four pixels (P1 to P4) positioned in a matrix of 2×2. The generated image data is the sum of the first data (+A1, +A2, −A1, A0), the second data (+B1, B0, B0, −B1), and the third data (+C3, C2, C2, +C1). Each pixel can perform display in accordance with the sum of the first to third data and can correct the original image data.

For example, the first data and the second data can be data for correction. The third data can be the original image data.

Combining the correction data and the image data enables, for example, upconversion, HDR display, correction of display unevenness unique to display devices, or correction of the threshold voltage of transistors included in pixels. Alternatively, these can be combined.

In an upconversion operation, for example, the same image data is supplied to all the four pixels, and by correction data, different images can be displayed on each of the pixels. For example, image data that is applied to one certain pixel of data for 4K2K is input to four certain pixels in a display device that includes pixels corresponding to 8K4K, and the resolution is increased by correction data input to each pixel, and thus display can be performed.

Alternatively, the luminance of a displayed image can be significantly improved when the same image data is used as the first data to the third data. This operation can supply a voltage higher than the maximum output value of a driving circuit to the pixel, leading to not only higher image quality but also lower power consumption and lower production cost owing to the use of an inexpensive driver IC chip.

Different images superimposed on each other can be displayed, which is the correction of image data in a broad sense. FIG. 16(B) illustrates images of the entire display portion: a first image composed of the first data; a second image composed of the second data; a third image composed of the third data; and an image synthesized from the first image, the second image, and the third image.

For example, such a combination of different image data can be applied to insertion of a character, display of AR (Augmented Reality), or the like.

As described above, when the light-emitting element emits light with the use of the image signal (image data) and the correction signal (data for correction), the amount of current flowing through the light-emitting element can be increased, and high luminance can be achieved. Thus, image correction such as image upconversion, HDR display in which part of or the whole image in a display region is corrected, or improvement in the luminance of a displayed image can be performed. A plurality of images can be superimposed and displayed. Moreover, a voltage higher than the output voltage of a source driver can be applied as the gate voltage of the driving transistor, so that power consumption of the source driver can be reduced.

This embodiment can be combined with any of the other embodiments as appropriate.

Embodiment 3

In this embodiment, materials that can be used for a light-emitting element are described.
[Materials of Light-Emitting Element]

Examples of the materials that can be used for each layer of the light-emitting element illustrated in FIG. 4 are described below. Note that each layer is not limited to a single layer and may be a stack of two or more layers.
<First Electrode and Second Electrode>

As materials used for the first electrode 1101 and the second electrode 1102, any of the materials below can be used in an appropriate combination as long as the functions of both electrodes described above can be fulfilled. For example, a metal, an alloy, an electrically conductive compound, a mixture of these, and the like can be appropriately used. Specifically, an In—Sn oxide (also referred to as ITO), an In—Si—Sn oxide (also referred to as ITSO), an In—Zn oxide, or an In—W—Zn oxide can be used. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., a rare earth metal such as lithium (Li), cesium (Cs), calcium (Ca), strontium (Sr), europium (Eu), or ytterbium (Yb), an alloy containing an appropriate combination of any of these, graphene, or the like.
<Light-Emitting Layer>

The light-emitting layer 1113 contains a light-emitting substance. As described in Embodiment 1, there is no particular limitation on the light-emitting substance. For example, a fluorescent material, a phosphorescence material, a TADF material, a quantum dot material, and a metal-halide perovskite material can be used as the light-emitting substance.

A pyrene derivative has a high emission quantum yield and is favorable as a fluorescent material exhibiting blue light. Specific examples of pyrene derivatives include N,N'-bis(3-methylphenyl)-N,N'-bis[3-(9-phenyl-9H-fluoren-9-yl)phenyl]pyrene-1,6-diamine (abbreviation: 1,6mMemFLPAPm), N,N'-diphenyl-N,N'-bis[4-(9-phenyl-9H-fluoren-9-yl)phenyl]pyrene-1,6-diamine (abbreviation: 1,6FLPAPm), N,N'-bis(dibenzofuran-2-yl)-N,N'-diphenylpyrene-1,6-diamine (abbreviation: 1,6FrAPm), N,N'-bis(dibenzothiophen-2-yl)-N,N'-diphenylpyrene-1,6-diamine (abbreviation: 1,6ThAPm), N,N'-(pyrene-1,6-diyl)bis[(N-phenylbenzo[b]naphtho[1,2-d]furan)-6-amine] (abbreviation: 1,6BnfAPm), N,N'-(pyrene-1,6-diyl)bis[(N-phenylbenzo[b]naphtho[1,2-d]furan)-8-amine] (abbreviation: 1,6BnfAPm-02), and N,N'-(pyrene-1,6-diyl)bis[(6,N-diphenylbenzo[b]naphtho[1,2-d]furan)-8-amine] (abbreviation: 1,6BnfAPm-03).

Alternatively, a high molecular compound can be used for the light-emitting layer 1113. Examples of the materials that emit blue light include poly(9,9-dioctylfluorene-2,7-diyl) (abbreviation: POF), poly[(9,9-dioctylfluorene-2,7-diyl)-co-(2,5-dimethoxybenzene-1,4-diyl)] (abbreviation: PF-DMOP), and poly {(9,9-dioctylfluorene-2,7-diyl)-co-[N,N'-di-(p-butylphenyl)-1,4-diaminobenzene]} (abbreviation: TAB-PFH).

As examples of a phosphorescent material which exhibits blue or green and whose emission spectrum has a peak wavelength at greater than or equal to 450 nm and less than or equal to 570 nm, the following substances can be given.

For example, organometallic complexes having a 4H-triazole skeleton, such as tris{2-[5-(2-methylphenyl)-4-(2,6-dimethylphenyl)-4H-1,2,4-triazol-3-yl-κ$N^2$]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), and tris[3-(5-biphenyl)-5-isopropyl-4-phenyl-4H-1,2,4-triazolato]iridium(III) (abbreviation: [Ir(iPr5btz)$_3$]); organometallic complexes having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); organometallic complexes having an imidazole skeleton, such as fac-tris[1-(2,6-diisopropylphenyl)-2-phenyl-1H-imidazole]iridium(III) (abbreviation: [Ir(iPrpm1)$_3$]) and tris[3-(2,6-dimethylphenyl)-7-methylimidazo[1,2-f]phenanthridinato]iridium(III) (abbreviation: [Ir(dmpimpt-Me)$_3$]); and organometallic complexes in which a phenylpyridine derivative having an electron-withdrawing group is a ligand, such as bis[2-(4',6'-difluorophenyl)pyridinato-N,C²]iridium(III) tetrakis(1-pyrazolyl)borate (abbreviation: FIr6), bis[2-(4',6'-difluorophenyl)pyridinato-N,C²]iridium(III) picolinate (abbreviation: FIrpic), bis{2-[3',5'-bis(trifluoromethyl)phenyl]pyridinato-N,C²'}iridium(III) picolinate (abbreviation: [Ir(CF$_3$ppy)$_2$(pic)]), and bis[2-(4',6'-difluorophenyl)pyridinato-N,C²']iridium(III) acetylacetonate (abbreviation: FIr(acac)) can be given.

Note that as the blue-light-emitting substance, a substance whose photoluminescence peak wavelength is preferably greater than or equal to 430 nm and less than or equal to 470 nm, further preferably greater than or equal to 430 nm and less than or equal to 460 nm is preferably used. Note that the photoluminescence may be measured with either a solution or a thin film.

With the parallel use of such compounds and the microcavity effect, the above chromaticity can be met more easily. Here, a semi-transmissive and semi-reflective electrode (a metal thin film portion) that is needed for obtaining the microcavity effect has a thickness of preferably greater than or equal to 20 nm and less than or equal to 40 nm, further preferably greater than 25 nm and less than or equal to 40 nm. However, the thickness greater than 40 nm possibly reduces the efficiency.

The light-emitting layer 1113 may contain one or more kinds of organic compounds (e.g., a host material or an assist material) in addition to the light-emitting substance (guest material). As the organic compound, a substance having an energy gap greater than the energy gap of light-emitting substance can be used. As the one or more kinds of organic compounds, one or both of a compound that easily accepts holes (hole-transport material) and a compound that easily accepts electrons (electron-transport material) can be used.

When the light-emitting substance is a fluorescent material, it is preferable to use, as the host material, an organic compound that has a high energy level in a singlet excited state and has a low energy level in a triplet excited state. For example, an anthracene derivative or a tetracene derivative is preferably used. Specific examples thereof include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 5,12-diphenyltetracene, and 5,12-bis(biphenyl-2-yl)tetracene.

When the light-emitting substance is a phosphorescent material, an organic compound having triplet excitation energy (energy difference between a ground state and a triplet excited state) higher than that of the light-emitting substance can be selected as the host material. In that case, it is possible to use a zinc-based metal complex, an aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, a phenanthroline derivative, an aromatic amine, a carbazole derivative, and the like.

Specific examples include metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)-tris(1-phenyl-1H-benzimidazole) (abbreviation: TPBI), bathophenanthroline (abbreviation: BPhen), bathocuproine (abbreviation: BCP), 2,9-bis(naphthalen-2-yl)-4,7-diphenyl-1,10-phenanthroline (abbreviation: NBphen), and 9-[4-(5-phenyl-1,3,4-oxadiazol-2-yl)phenyl]-9H-carbazole (abbreviation: CO11); and aromatic amine compounds such as NPB, TPD, and BSPB.

In addition, condensed polycyclic aromatic compounds such as anthracene derivatives, phenanthrene derivatives, pyrene derivatives, chrysene derivatives, and dibenzo[g,p]chrysene derivatives can be used. Specifically, 9,10-diphenylanthracene (abbreviation: DPAnth), N,N-diphenyl -9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), 9,10-diphenyl-2-[N-phenyl-N-(9-phenyl-9H-carbazol-3-yl)amino]anthracene (abbreviation: 2PCAPA), 6,12-dimethoxy-5,11-diphenylchrysene, N,N,N',N',N",N",N"',N"'-octaphenyldibenzo[g,p]chrysene-2,7,10,15-tetraamine (abbreviation: DBC1), 9-[4-(10-phenyl-9-anthracenyl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), or the like can be used.

When a plurality of organic compounds are used for the light-emitting layer 1113, compounds that form an exciplex are preferably mixed with a light-emitting substance. In that case, any of various organic compounds can be used in an appropriate combination; to form an exciplex efficiently, it is particularly preferable to combine the hole-transport material and the electron-transport material.

The TADF material is a material that can up-convert a triplet excited state into a singlet excited state (reverse intersystem crossing) using a little thermal energy and efficiently exhibits light emission (fluorescence) from the singlet excited state. The thermally activated delayed fluorescence is efficiently obtained under the condition where the difference in energy between the triplet excited level and the singlet excited level is greater than or equal to 0 eV and less than or equal to 0.2 eV, preferably greater than or equal to 0 eV and less than or equal to 0.1 eV. Note that delayed fluorescence by the TADF material refers to light emission having the same spectrum as normal fluorescence and an extremely long lifetime. The lifetime is $10^{-6}$ seconds or longer, preferably $10^{-3}$ seconds or longer.

Examples of the TADF material include fullerene, a derivative thereof, an acridine derivative such as proflavine, and eosin. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (abbreviation: $SnF_2$(Proto IX)), a mesoporphyrin-tin fluoride complex (abbreviation: $SnF_2$(Meso IX)), a hematoporphyrin-tin fluoride complex (abbreviation: $SnF_2$(Hemato IX)), a coproporphyrin tetramethyl ester-tin fluoride complex (abbreviation: $SnF_2$(Copro III-4Me)), an octaethylporphyrin-tin fluoride complex (abbreviation: $SnF_2$(OEP)), an etioporphyrin-tin fluoride complex (abbreviation: $SnF_2$(Etio I)), and an octaethylporphyrin-platinum chloride complex (abbreviation: $PtCl_2OEP$).

Alternatively, a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl -10H,10'H-spiro[acridin-9,9'-anthracen]-10'-one (abbreviation: ACRSA) can be used. Note that a substance in which a π-electron rich heteroaromatic ring is directly bonded to a π-electron deficient heteroaromatic ring is particularly preferable because both the donor property of the π-electron rich heteroaromatic ring and the acceptor property of the π-electron deficient heteroaromatic ring are improved and the energy difference between the singlet excited state and the triplet excited state becomes small.

Note that the TADF material can also be used in combination with another organic compound.

<Hole-Injection Layer and Hole-Transport Layer>

The hole-injection layer 1111 injects holes from the first electrode 1101 that is an anode or the charge generation layer 1109 to the EL layer 1103B or the light-emitting unit 1123B and contains a material with a high hole-injection property.

Examples of the material with a high hole-injection property include transition metal oxides such as molybdenum oxide, vanadium oxide, ruthenium oxide, tungsten oxide, and manganese oxide. Alternatively, it is possible to use any of the following materials: phthalocyanine-based compounds such as phthalocyanine (abbreviation: $H_2Pc$) and copper phthalocyanine (abbreviation: CuPc); aromatic amine compounds such as 4,4'-bis[N-(4-diphenylaminophenyl)-N-phenylamino]biphenyl (abbreviation: DPAB) and N,N-bis {4-[bis(3-methylphenyl)amino]phenyl}-N,N'-diphenyl-(1,1'-biphenyl)-4,4'-diamine (abbreviation: DNTPD); high molecular compounds such as poly(3,4-ethylenedioxythiophene)/poly(styrenesulfonic acid) (abbreviation: PEDOT/PSS); and the like.

Alternatively, as the material having a high hole-injection property, a composite material containing a hole-transport material and an acceptor material (electron-accepting material) can be used. In that case, the acceptor material extracts electrons from a hole-transport material, so that holes are generated in the hole-injection layer 1111 and the holes are injected into the light-emitting layer 1113 through the hole-transport layer 1112. Note that each of the hole-injection layer 1111 may be formed to have a single-layer structure using a composite material containing a hole-transport material and an acceptor material (electron-accepting material), or a stacked-layer structure in which a layer including a hole-transport material and a layer including an acceptor material (electron-accepting material) are stacked.

The hole-transport layer 1112 transports holes injected from the first electrode 1101 through the hole-injection layer 1111, to the light-emitting layer 1113. The hole-transport layer 1112 contains a hole-transport material. It is particularly preferable that the HOMO level of the hole-transport material included in the hole-transport layer 1112 be the same as or close to that of the hole-injection layer 1111.

As the acceptor material used for the hole-injection layer 1111, an oxide of a metal belonging to any of Group 4 to Group 8 of the periodic table can be used. As specific examples, molybdenum oxide, vanadium oxide, niobium oxide, tantalum oxide, chromium oxide, tungsten oxide, manganese oxide, and rhenium oxide can be given. Among these, molybdenum oxide is especially preferable since it is stable in the air, has a low hygroscopic property, and is easy to handle. Alternatively, organic acceptors such as a quinodimethane derivative, a chloranil derivative, and a hexaazatriphenylene derivative can be used. Specifically, 7,7,8,8-tetracyano -2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), and the like can be used.

The hole-transport materials used for the hole-injection layer 1111 and the hole-transport layer 1112 are preferably substances with a hole mobility of greater than or equal to $10^{-6}$ cm$^2$/Vs. Note that other substances can also be used as long as the substances have a hole-transport property higher than an electron-transport property.

Preferred hole-transport materials are π-electron rich heteroaromatic compounds (e.g., carbazole derivatives and indole derivatives) and aromatic amine compounds, examples of which include compounds having an aromatic amine skeleton, such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 3-[4-(9-phenanthryl)-phenyl]-9-phenyl-9H-carbazole (abbreviation: PCPPn), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 4,4',4''-tris(carbazol-9-yl)triphenylamine (abbreviation: TCTA), 4,4',4''-tris(N,N-diphenylamino)triphenylamine (abbreviation: TDATA), and 4,4',4''-tris[N-(3-methylphenyl)-N-phenylamino]triphenylamine (abbreviation: MTDATA); compounds having a carbazole skeleton, such as 1,3-bis(N-carbazolyl)benzene (abbreviation: mCP), 4,4'-di(N-carbazolyl)biphenyl (abbreviation: CBP), 3,6-bis (3,5-diphenylphenyl)-9-phenylcarbazole (abbreviation: CzTP), 3,3'-bis(9-phenyl-9H-carbazole) (abbreviation: PCCP), 34N-(9-phenylcarbazol-3-yl)-N-phenylaminol-9- phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenyl-carbazol-3-yl)amino]-9-phenylcarbazole (abbreviation: PCzPCN1), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA); compounds having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II).

High molecular compounds such as poly(N-vinylcarbazole) (abbreviation: PVK), poly(4-vinyltriphenylamine) (abbreviation: PVTPA), poly[N-(4-{N-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD) can also be used.

Note that the hole-transport material is not limited to the above examples and may be one of or a combination of various known materials when used for the hole-injection layer 1111 and the hole-transport layer 1112.

<Electron-Transport Layer>

The electron-transport layer 1114 transports electrons injected from the second electrode 1102 through the electron-injection layer 1115 to the light-emitting layer 1113. Note that the electron-transport layer 1114 contains an electron-transport material. It is preferable that the electron-transport material contained in the electron-transport layer 1114 be a substance with an electron mobility of higher than or equal to $1 \times 10^{-6}$ cm$^2$/Vs. Note that any other substance can also be used as long as the substance transports electrons more easily than it transports holes.

Examples of the electron-transport material include metal complexes having a quinoline ligand, a benzoquinoline ligand, an oxazole ligand, and a thiazole ligand; an oxadiazole derivative; a triazole derivative; a phenanthroline derivative; a pyridine derivative; and a bipyridine derivative. In addition, a π-electron deficient heteroaromatic compound such as a nitrogen-containing heteroaromatic compound can also be used.

Specifically, it is possible to use any of metal complexes such as Alq$_3$, tris(4-methyl-8-quinolinolato)aluminum(III) (abbreviation: Almq$_3$), bis(10-hydroxybenzo[h]quinolinato)beryllium(II) (abbreviation: BeBq$_2$), BAlq, Zn(BOX)$_2$, and bis[2-(2-hydroxyphenyl)benzothiazolato]zinc(II) (abbreviation: Zn(BTZ)$_2$); heteroaromatic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4'-tert-butylphenyl)-4-phenyl-5-(4"-biphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: Bphen), bathocuproine (abbreviation: BCP), and 4,4'-bis(5-methylbenzoxazol-2-yl)stilbene (abbreviation: BzOs); and quinoxaline derivatives and dibenzoquinoxaline derivatives such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

Furthermore, a high-molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used.

<Electron-Injection Layer>

The electron-injection layer 1115 contains a substance having a high electron injection property. For the electron-injection layer 1115, an alkali metal, an alkaline earth metal, or a compound thereof such as lithium fluoride (LiF), cesium fluoride (CsF), calcium fluoride (CaF$_2$), or lithium oxide (LiO$_x$) can be used. A rare earth metal compound like erbium fluoride (ErF$_3$) can also be used. In addition, an electride may be used for the electron-injection layer 1115. Examples of the electride include a substance in which electrons are added at high concentration to a mixed oxide of calcium and aluminum. Any of the above-described substances for forming the electron-transport layer 1114 can also be used.

A composite material in which an organic compound and an electron donor (donor) are mixed may also be used for the electron-injection layer 1115. Such a composite material is excellent in an electron-injection property and an electron-transport property because electrons are generated in the organic compound by the electron donor. The organic compound here is preferably a material excellent in transporting the generated electrons; specifically, for example, the above-described electron-transport materials for the electron-transport layer 1114 (e.g., a metal complex or a heteroaromatic compound) can be used. As the electron donor, a substance showing an electron-donating property with respect to an organic compound is used. Specifically, an alkali metal, an alkaline earth metal, and a rare earth metal are preferable, and lithium, cesium, magnesium, calcium, erbium, ytterbium, and the like are given. In addition, an alkali metal oxide and an alkaline earth metal oxide are preferable, and lithium oxide, calcium oxide, barium oxide, and the like are given. Alternatively, a Lewis base such as magnesium oxide can be used. Further alternatively, an organic compound such as tetrathiafulvalene (abbreviation: TTF) can be used.

<Charge-Generation Layer>

The charge-generation layer 1109 can have a structure in which an electron acceptor (acceptor) is added to a hole-transport material or an electron donor (donor) is added to an electron-transport material. Alternatively, both of these structures may be stacked. Note that by the formation of the charge-generation layer 1109 using any of the above materials, it is possible to suppress an increase in driving voltage caused by stacking the EL layers.

In the case where the charge-generation layer 1109 has a structure in which an electron acceptor is added to a hole-transport material, any of the materials described in this embodiment can be used as the hole-transport material. As the electron acceptor, it is possible to use 7,7,8,8-tetracyano-2,3,5,6-tetrafluoroquinodimethane (abbreviation: F$_4$-TCNQ), chloranil, and the like. Other examples include oxides of metals that belong to Group 4 to Group 8 of the periodic table. Specific examples are vanadium oxide, niobium oxide, tantalum oxide, chromium oxide, molybdenum oxide, tungsten oxide, manganese oxide, and rhenium oxide.

In the case where the charge-generation layer 1109 has a structure in which an electron donor is added to an electron-transport material, any of the materials described in this embodiment can be used as the electron-transport material. As the electron donor, it is possible to use an alkali metal, an alkaline earth metal, a rare earth metal, metals that belong to Groups 2 and 13 of the periodic table, or an oxide or carbonate thereof. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may be used as the electron donor.

For fabrication of the light-emitting element in this embodiment, a vacuum process such as an evaporation method or a solution process such as a spin coating method or an ink-jet method can be used. When an evaporation method is used, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the functional layers (the hole-injection layers, the hole-transport layers, the light-emitting layers, the electron-transport layers, the electron-injection layers) included in the EL layers and the charge generation layer of the light-emitting element can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, or micro-contact printing), or the like.

Note that materials that can be used for the functional layers (the hole-injection layer, the hole-transport layer, the light-emitting layer, the electron-transport layer, and the electron-injection layer) included in the EL layer and the charge generation layer of the light-emitting element described in this embodiment are not limited to the above materials, and other materials can be used in combination as long as the functions of the layers are fulfilled. For example, a high molecular compound (e.g., an oligomer, a dendrimer, and a polymer), a middle molecular compound (a compound between a low molecular compound and a high molecular compound, with a molecular weight of 400 to 4000), or an inorganic compound (e.g., a quantum dot material) can be used. The quantum dot material may be a colloidal quantum dot material, an alloyed quantum dot material, a core-shell quantum dot material, a core quantum dot material, or the like.

This embodiment can be combined with any of the other embodiments as appropriate.

Embodiment 4

In this embodiment, electronic devices of embodiments of the present invention are described with reference to FIG. 17 and FIG. 18.

The electronic device in this embodiment includes the display device of one embodiment of the present invention in its display portion. The display device of one embodiment of the present invention can be easily increased in size. In addition, the display device of one embodiment of the present invention has high reliability and low power consumption. Thus, the display device of one embodiment of the present invention can be used for a display portion of a variety of electronic devices.

The display portion of the electronic device in this embodiment can display a video with definition of, for example, full high definition, 4K2K, 8K4K, 16K8K, or higher. In addition, as a screen size of the display portion, the diagonal size can be greater than or equal to 20 inches, greater than or equal to 30 inches, greater than or equal to 50 inches, greater than or equal to 60 inches, or greater than or equal to 70 inches.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment can be incorporated along a curved surface of an inside wall or an outside wall of a house or a building or the interior or the exterior of a car.

The electronic device in this embodiment may include an antenna. When a signal is received by the antenna, the electronic device can display a video, data, or the like on the display portion. When the electronic device includes the antenna and a secondary battery, the antenna may be used for contactless power transmission.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 17A:
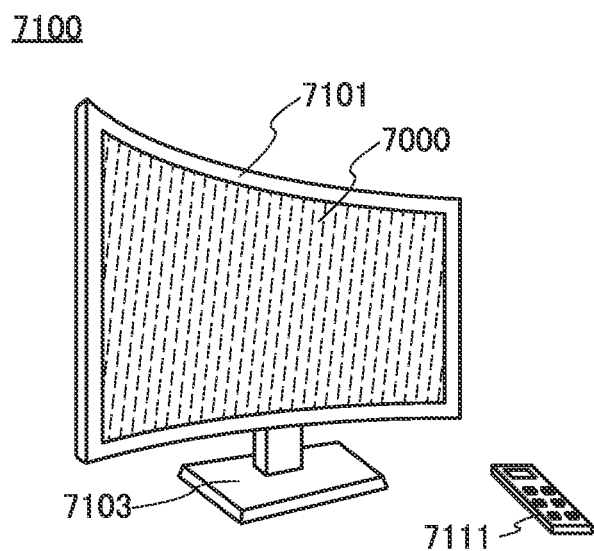
FIG. 17(A) to FIG. 17(D) Diagrams illustrating examples of an electronic device.

FIG. 17(A) illustrates an example of a television device. In a television device 7100, a display portion 7000 is incorporated in a housing 7101. Here, a structure in which the housing 7101 is supported by a stand 7103 is illustrated.

The display device of one embodiment of the present invention can be used for the display portion 7000.

Operation of the television device 7100 illustrated in FIG. 17(A) can be performed with an operation switch provided in the housing 7101 or a separate remote controller 7111. Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device 7100 is connected to a communication network with or without wires via the modem, one-way (from a transmitter to a receiver) or two-way (between a transmitter and a receiver or between receivers, for example) data communication can be performed.

Figure 17B:
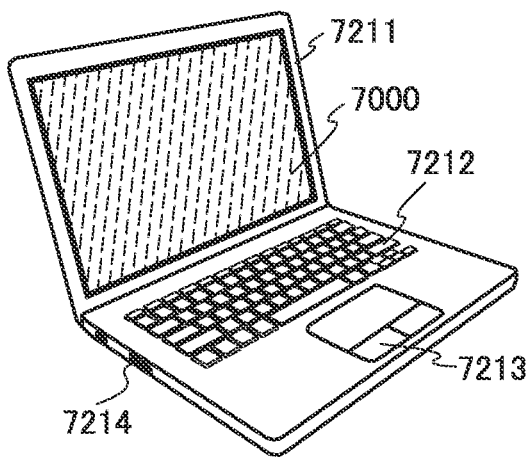

FIG. 17(B) illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used for the display portion 7000.

Figure 17C:
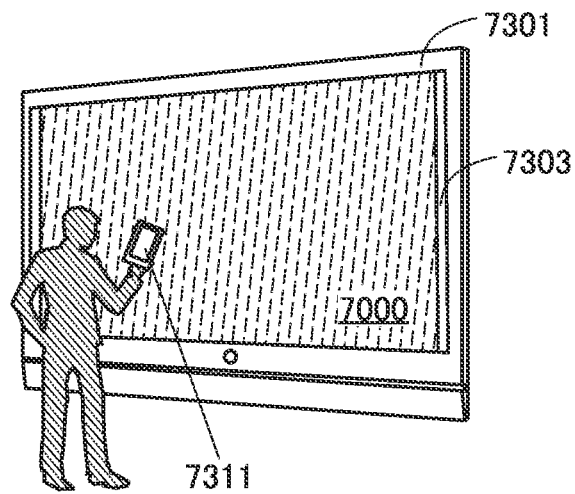
Figure 17D:
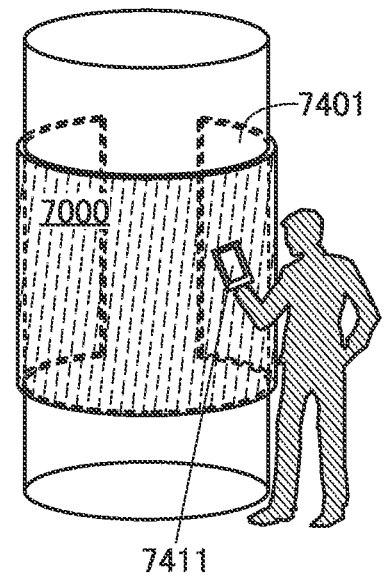

FIG. 17(C) and FIG. 17(D) illustrate examples of digital signage.

Digital signage 7300 illustrated in FIG. 17(C) includes a housing 7301, the display portion 7000, a speaker 7303, and the like. Furthermore, the digital signage can include an LED lamp, operation keys (including a power switch or an operation switch), a connection terminal, any of a variety of sensors, a microphone, and the like.

FIG. 17(D) is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIG. 17(C) and FIG. 17(D).

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of an image or a moving image on the display portion 7000, intuitive operation by a user is possible. Moreover, for an application for providing information such as route information or traffic information, usability can be enhanced by intuitive operation.

Furthermore, as illustrated in FIG. 17(C) and FIG. 17(D), it is preferable that the digital signage 7300 or the digital signage 7400 be capable of working with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic devices illustrated in FIG. 18(A) to FIG. 18(F) include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 18(A) to FIG. 18(F) have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The electronic devices illustrated in FIG. 18(A) to FIG. 18(F) are described in detail below.

Figure 18A:
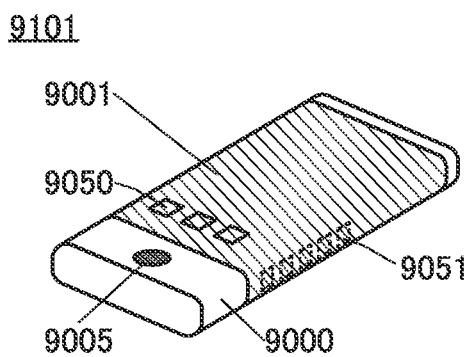
FIG. 18(A) to FIG. 18(F) Diagrams illustrating examples of an electronic device.

FIG. 18(A) is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 18(A) shows an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 18B:
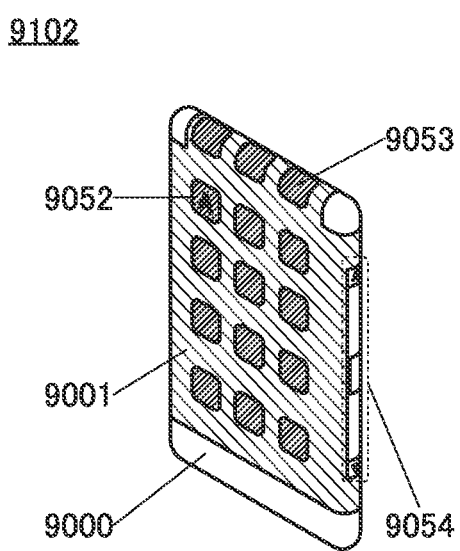

FIG. 18(B) is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, the user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 18C:
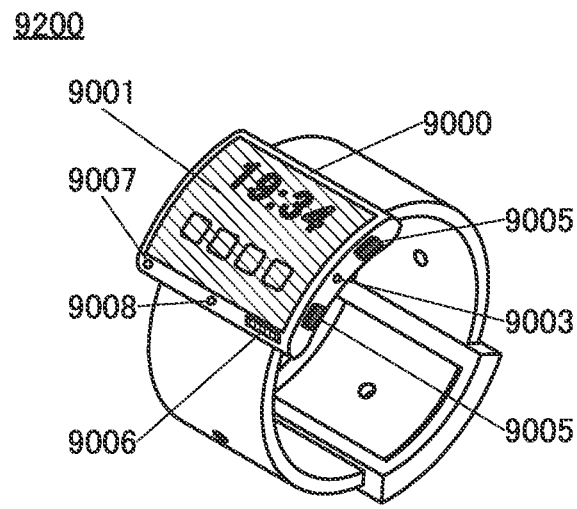

FIG. 18(C) is a perspective view illustrating a watch-type portable information terminal 9200. For example, the portable information terminal 9200 can be used as a smart watch. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 18D:
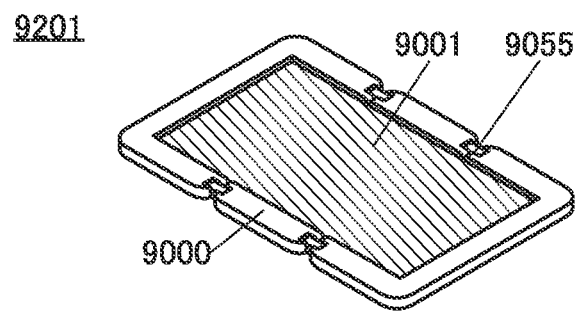
Figure 18E:
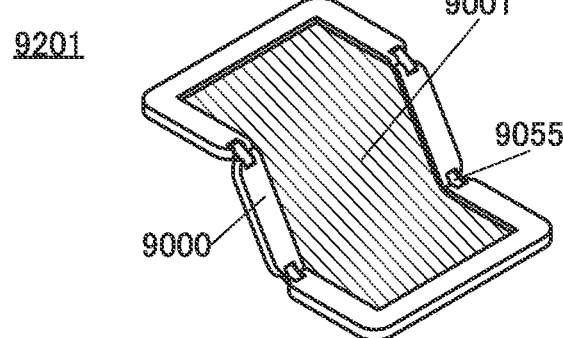
Figure 18F:
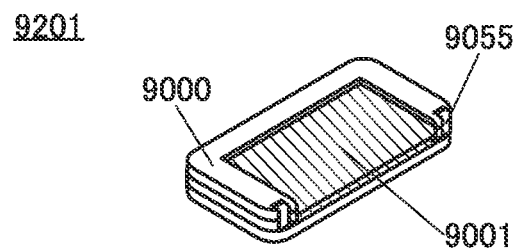

FIG. 18(D), FIG. 18(E), and FIG. 18(F) are perspective views showing a foldable portable information terminal 9201. FIG. 18(D) is a perspective view of an opened state of the portable information terminal 9201, FIG. 18(F) is a perspective view of a folded state thereof, and FIG. 18(E) is a perspective view of a state in the middle of change from one of FIG. 18(D) and FIG. 18(F) to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature of greater than or equal to 0.1 mm and less than or equal to 150 mm.

This embodiment can be combined with the other embodiments as appropriate.

REFERENCE NUMERALS

CCMG: color conversion layer, CCMR: color conversion layer, C1: capacitor, C2: capacitor, C11: capacitor, C12: capacitor, DATA: image data, DATA_W: data, DATA_W1: data, DATA_W2: data, DL: wiring, DL1: wiring, DL11: wiring, DL12: wiring, DL13: wiring, DLW1: wiring, GL: wiring, GL1: wiring, GL2: wiring, GL3: wiring, GL11: wiring, GL12: wiring, GL13: wiring, MEM: memory circuit, M1: transistor, M2: transistor, M3: transistor, M4: transistor, M5: transistor, M11: transistor, M12: transistor, M13: transistor, ND1: node, ND2: node, ND11: node, ND12: node, ND13: node, PIX: pixel, V0: wiring, 10A: display device, 10B: display device, 10C: display device, 10D: display device, 11: display portion, 13: gate driver, 14: source driver, 15: display device, 71: display portion, 74: FPC, 78: driver circuit, 100: pixel, 101: pixel, 104: insulating layer, 107: partition, 110: light-emitting element, 110B: light-emitting element, 111: pixel electrode, 113: EL layer, 115: common electrode, 117: protective layer, 120: circuit, 121: space, 141: insulating layer, 150: circuit block, 171: transistor, 172: transistor, 173: capacitor, 175: transistor, 186: wiring, 187: power supply line, 189: common wiring, 190: wiring, 191: wiring, 201: conductive layer, 202: insulating layer, 203a: conductive layer, 203b: conductive layer, 204: semiconductor layer, 208: insulating layer, 211: insulating layer, 212: insulating layer, 213: insulating layer, 214a: channel formation region, 214b: low-resistance region, 214c: LDD region, 220: transistor, 230: transistor, 301: transistor, 303: transistor, 306: connection portion, 307: wiring, 311: gate insulating layer, 312: insulating layer, 313: insulating layer, 314: insulating layer, 315: insulating layer, 317: bonding layer, 318: bonding layer, 319: connector, 355: conductive layer, 361: substrate, 363: bonding layer, 365: insulating layer, 367: insulating layer, 371: substrate, 1100B: pixel, 1100G: pixel, 1100R: pixel, 1100W: pixel, 1101: electrode, 1102: electrode, 1103B: EL layer, 1104G: color conversion layer, 1104R: color conversion layer, 1104W: color conversion layer, 1105B: light-emitting element, 1106B: light, 1106G: light, 1106R: light, 1106W: light, 1107: optical adjustment layer, 1109: charge generation layer, 1111: hole-injection layer, 1112: hole-transport layer, 1113: light-emitting layer, 1114: electron-transport layer, 1115: electron-injection layer, 1123B: light-emitting unit, 4000: molecular weight, 7000: display portion, 7100: television, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: control key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A display device comprising a first pixel,
    wherein the first pixel includes a first light-emitting element, a color conversion layer, and a first memory circuit,
    wherein the first light-emitting element exhibits blue light,
    wherein the color conversion layer is configured to convert light emitted by the first light-emitting element into light having a longer wavelength,
    wherein a first image signal, a first correction signal and a third correction signal are supplied to the first pixel,
    wherein the first memory circuit is configured to retain the first correction signal and add the first correction signal to the first image signal, retain the third correction signal, and add the third correction signal to the first image signal, and
    wherein the first pixel is configured to display an image using the first image signal, the first correction signal, and the third correction signal.

2. The display device according to claim 1,
    wherein the color conversion layer includes a quantum dot.

3. The display device according to claim 1,
    wherein the first pixel further includes a transistor, and
    wherein the transistor includes a metal oxide in a channel formation region.

4. The display device according to claim 1, further comprising a second pixel,
    wherein the second pixel includes a second light-emitting element and a second memory circuit,
    wherein the second light-emitting element exhibits blue light,
    wherein a second image signal and a second correction signal are supplied to the second pixel,
    wherein the second memory circuit is configured to retain the second correction signal and add the second correction signal to the second image signal,
    wherein the second pixel is configured to display an image using the second image signal and the second correction signal,
    wherein the first pixel is a pixel exhibiting light of a color different from the second pixel, and
    wherein the second pixel is a pixel exhibiting blue light.

5. A display module comprising the display device according to claim 1, and a connector or an integrated circuit.

6. An electronic device comprising:
    the display module according to claim 5, and
    at least one of an antenna, a battery, a housing, a camera, a speaker, a microphone, and an operation button.

7. A display device comprising a first pixel,
    wherein the first pixel includes a first light-emitting element, a color conversion layer, and a first memory circuit,
    wherein the first light-emitting element exhibits blue light,
    wherein the first light-emitting element includes a stack of a first light-emitting unit exhibiting blue light and a second light-emitting unit exhibiting blue light,
    wherein the color conversion layer is configured to convert light emitted from the first light-emitting element into light having a longer wavelength,
    wherein a first image signal a first correction signal and a third correction signal are supplied to the first pixel,
    wherein the first memory circuit is configured to retain the first correction signal and add the first correction signal to the first image signal, retain the third correction signal, and add the third correction signal to the first image signal, and wherein the first pixel is configured to display an image using the first image signal, the first correction signal, and the third correction signal.

8. The display device according to claim 7,
wherein the color conversion layer includes a quantum dot.

9. The display device according to claim 7,
wherein the first pixel further includes a transistor, and
wherein the transistor includes a metal oxide in a channel formation region.

10. The display device according to claim 7, further comprising a second pixel,
wherein the second pixel includes a second light-emitting element and a second memory circuit,
wherein the second light-emitting element exhibits blue light,
wherein the second light-emitting element includes a stack of the first light-emitting unit exhibiting blue light and the second light-emitting unit exhibiting blue light,
wherein a second image signal and a second correction signal are supplied to the second pixel,
wherein the second memory circuit is configured to retain the second correction signal and add the second correction signal to the second image signal,
wherein the second pixel is configured to display an image using the second image signal and the second correction signal,
wherein the first pixel is a pixel exhibiting light of a color different from the second pixel, and
wherein the second pixel is a pixel exhibiting blue light.

11. The display device according to claim 7,
wherein the first light-emitting unit and the second light-emitting unit each emit fluorescence.

12. The display device according to claim 7,
wherein the first light-emitting element includes a stack of a first light-emitting unit exhibiting blue light, a second light-emitting unit exhibiting blue light, and a third light-emitting unit exhibiting blue light.

13. The display device according to claim 12,
wherein the first light-emitting unit, the second light-emitting unit, and the third light-emitting unit each emit fluorescence.

14. A display device comprising a first pixel,
wherein the first pixel includes a first light-emitting element, a color conversion layer, a first transistor, a second transistor, a third transistor, a first capacitor, and a second capacitor,
wherein the first light-emitting element exhibits blue light,
wherein the color conversion layer is configured to convert light emitted by the first light-emitting element into light having a longer wavelength,
wherein a first image signal, a first correction signal and a third correction signal are supplied to the first pixel,
wherein one of a source and a drain of the first transistor and one terminal of the first capacitor are electrically connected to each other,
wherein the first image signal is supplied to the other of the source and the drain of the first transistor,
wherein one of a source and a drain of the second transistor, the other terminal of the first capacitor, and one terminal of the second capacitor are electrically connected to one another,
wherein the first correction signal is supplied to the other of the source and the drain of the second transistor,
wherein one of a source and a drain of the third transistor and the other terminal of the second capacitor are electrically connected to each other, and
wherein the third correction signal is supplied to the other of the source and the drain of the third transistor.

15. The display device according to claim 14,
wherein the color conversion layer includes a quantum dot.

16. The display device according to claim 14,
wherein the first pixel further includes a transistor, and
wherein the transistor includes a metal oxide in a channel formation region.

17. The display device according to claim 14, further comprising a second pixel,
wherein the second pixel includes a second light-emitting element and a second memory circuit,
wherein the second light-emitting element exhibits blue light,
wherein a second image signal and a second correction signal are supplied to the second pixel,
wherein the second memory circuit is configured to retain the second correction signal and add the second correction signal to the second image signal,
wherein the second pixel is configured to display an image using the second image signal and the second correction signal,
wherein the first pixel is a pixel exhibiting light of a color different from the second pixel, and
wherein the second pixel is a pixel exhibiting blue light.

18. A display module comprising the display device according to claim 14, and a connector or an integrated circuit.

19. An electronic device comprising:
the display module according to claim 18, and
at least one of an antenna, a battery, a housing, a camera, a speaker, a microphone, and an operation button.

* * * * *